(12) United States Patent
Fukuhara et al.

(10) Patent No.: US 12,346,026 B2
(45) Date of Patent: Jul. 1, 2025

(54) COMPOSITION FOR FORMING UNDERLAYER FILM, RESIST PATTERN FORMING METHOD, AND MANUFACTURING METHOD OF ELECTRONIC DEVICE

(71) Applicant: FUJIFILM Corporation, Tokyo (JP)

(72) Inventors: Toshiaki Fukuhara, Shizuoka (JP); Takeshi Kawabata, Shizuoka (JP); Sou Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 541 days.

(21) Appl. No.: 17/724,956

(22) Filed: Apr. 20, 2022

(65) Prior Publication Data

US 2022/0252985 A1 Aug. 11, 2022

Related U.S. Application Data

(63) Continuation of application No. PCT/JP2020/039638, filed on Oct. 22, 2020.

(30) Foreign Application Priority Data

Nov. 22, 2019 (JP) ................................ 2019-211566

(51) Int. Cl.
| | |
|---|---|
| *G03F 7/11* | (2006.01) |
| *G03F 7/075* | (2006.01) |
| *G03F 7/09* | (2006.01) |
| *G03F 7/20* | (2006.01) |
| *G03F 7/30* | (2006.01) |
| *G03F 7/32* | (2006.01) |

(52) U.S. Cl.
CPC .............. *G03F 7/11* (2013.01); *G03F 7/0757* (2013.01); *G03F 7/091* (2013.01); *G03F 7/2006* (2013.01); *G03F 7/2041* (2013.01); *G03F 7/30* (2013.01); *G03F 7/327* (2013.01)

(58) Field of Classification Search
CPC . G03F 7/11; G03F 7/30; G03F 7/0757; G03F 7/2041; G03F 7/091
See application file for complete search history.

(56) References Cited

U.S. PATENT DOCUMENTS

| | | | |
|---|---|---|---|
| 2006/0024980 A1* | 2/2006 | Tsuchiya | H01L 21/3121 257/E21.271 |
| 2006/0110610 A1* | 5/2006 | Matsutani | C08G 79/08 528/7 |
| 2007/0264596 A1 | 11/2007 | Ohsawa et al. | |
| 2012/0183908 A1* | 7/2012 | Anno | G03F 7/30 430/325 |
| 2013/0280912 A1 | 10/2013 | Ogihara et al. | |
| 2021/0181635 A1 | 6/2021 | Shibayama et al. | |

FOREIGN PATENT DOCUMENTS

| | | |
|---|---|---|
| JP | 2007-304490 A | 11/2007 |
| JP | 2013-224279 A | 10/2013 |
| JP | 2016-27370 A | 2/2016 |
| WO | 2019/059202 A1 | 3/2019 |
| WO | 2019/082934 A1 | 5/2019 |

OTHER PUBLICATIONS

Garcia-Turiel, J, Jerome, B, (2007). Solvent Retention in Thin Film Studied by Gas Chromatography Colloid Polymer Sci., 285: 1617-1623. (Year: 2007).*
International Search Report dated Jan. 12, 2021 from the International Searching Authority in International Application No. PCT/JP2020/039638.
Written Opinion dated Jan. 12, 2021 from the International Searching Authority in International Application No. PCT/JP2020/039638.
International Preliminary Report with the translation of Written Opinion dated May 17, 2022 from the International Searching Authority in International Application No. PCT/JP2020/039638.
Japanese Office Action dated Mar. 7, 2023 in Japanese Application No. 2021-558234.

* cited by examiner

*Primary Examiner* — John S. Chu
(74) *Attorney, Agent, or Firm* — Sughrue Mion, PLLC

(57) ABSTRACT

A composition for forming an underlayer film is used for forming an underlayer film under a resist film, the composition including a silicon atom-containing compound and a halogen-based solvent, in which a content of the halogen-based solvent is 1.0 ppb by mass to 50.0 ppm by mass with respect to a total mass of the composition for forming an underlayer film.

15 Claims, No Drawings

COMPOSITION FOR FORMING UNDERLAYER FILM, RESIST PATTERN FORMING METHOD, AND MANUFACTURING METHOD OF ELECTRONIC DEVICE

CROSS-REFERENCE TO RELATED APPLICATIONS

This application is a Continuation of PCT International Application No. PCT/JP2020/039638 filed on Oct. 22, 2020, which claims priority under 35 U.S.C § 119(a) to Japanese Patent Application No. 2019-211566 filed on Nov. 22, 2019. Each of the above application(s) is hereby expressly incorporated by reference, in its entirety, into the present application.

BACKGROUND OF THE INVENTION

1. Field of the Invention

The present invention relates to a composition for forming an underlayer film, a resist pattern forming method, and a manufacturing method of an electronic device.

2. Description of the Related Art

In processes for manufacturing semiconductor devices such as an integrated circuit (IC), microfabrication by lithography using a resist composition has been performed in the related art, and various pattern forming methods have been proposed. For example, there is also known a method in which an underlayer film is formed on a substrate, a resist composition is further applied on the underlayer film to form a resist film, and subsequent steps are carried out.

As a composition used to form the underlayer film, JP2016-027370A discloses a "polysiloxane composition for forming a resist underlayer film, containing a polysiloxane and an acid generator, in which the acid generator includes an onium cation and an acid anion, and the onium cation includes an alicyclic structure, an aliphatic heterocyclic structure, an aromatic ring structure having a chain substituent, or a combination thereof".

SUMMARY OF THE INVENTION

In a case of forming the underlayer film on the substrate (especially in a case where the substrate has irregularities), a composition for forming an underlayer film is required to be able to form an underlayer film having a flat surface.

After forming the underlayer film on the substrate and further forming the resist film on the underlayer film, for convenience of handling in the subsequent steps, the resist film on a portion formed on an end part (edge) of the substrate may be removed by using a solvent. In this case, in a case where solvent resistance of the underlayer film is insufficient, the underlayer film may be eroded by the solvent, and the resist film may not be sufficiently supported near the end part of the substrate. Therefore, the composition for forming an underlayer film is also required to be able to form an underlayer film having excellent solvent resistance.

In view of such circumstances, an object of the present invention is to provide a composition for forming an underlayer film, with which an underlayer film having excellent surface flatness and solvent resistance can be formed.

Another object of the present invention is to provide a resist pattern forming method and a manufacturing method of an electronic device, which are related to the composition for forming an underlayer film.

The present inventors have found that the above-described objects can be achieved by the following configurations.

[1]

A composition for forming an underlayer film, which is used for forming an underlayer film under a resist film, the composition comprising:

a silicon atom-containing compound; and a halogen-based solvent, in which a content of the halogen-based solvent is 1.0 ppb by mass to 50.0 ppm by mass with respect to a total mass of the composition for forming an underlayer film.

[2]

The composition for forming an underlayer film according to [1], in which the content of the halogen-based solvent is 1.0 ppm by mass to 10.0 ppm by mass with respect to the total mass of the composition for forming an underlayer film.

[3]

The composition for forming an underlayer film according to [1] or [2], in which the content of the halogen-based solvent is 20 ppb by mass to 750 ppm by mass with respect to a total mass of the silicon atom-containing compound.

[4]

The composition for forming an underlayer film according to any one of [1] to [3], in which the content of the halogen-based solvent is 500 ppb by mass to 100 ppm by mass with respect to a total mass of the silicon atom-containing compound.

[5]

The composition for forming an underlayer film according to any one of [1] to [4], in which the silicon atom-containing compound is a siloxane compound.

[6]

The composition for forming an underlayer film according to any one of [1] to [5], in which the silicon atom-containing compound is a hydrolysis condensate of one or more compounds selected from the group consisting of tetramethoxysilane, tetraethoxysilane, tetra-n-propoxysilane, tetra-iso-propoxysilane, tetraphenoxysilane, and a compound represented by General Formula (A),

$$R^1_n Si(OR^2)_{4-n} \quad (A)$$

in General Formula (A), $R^1$ and $R^2$ each independently represent a monovalent organic group, and n represents an integer of 1 to 3.

[7]

The composition for forming an underlayer film according to any one of [1] to [6], further comprising:

one or more compounds selected from the group consisting of an acid generator, a basic compound, and an acidic compound.

[8]

The composition for forming an underlayer film according to [7], in which the composition for forming an underlayer film includes the acid generator.

[9]
The composition for forming an underlayer film according to [7] or [8],
in which the acid generator is a compound represented by any one of General Formula (1), (2), or (3),

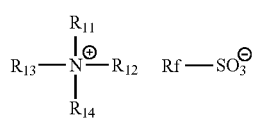

(1)

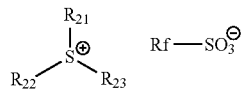

(2)

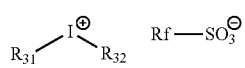

(3)

in General Formulae (1) to (3), $R_{11}$ to $R_{14}$, $R_{21}$ to $R_{23}$, $R_{31}$, and $R_{32}$ each independently represent an alkyl group or an aryl group, and Rf represents an organic group having one or more fluorine atoms,
in General Formula (2), two of $R_{21}$ to $R_{23}$ may be bonded to each other to form a ring.

[10]
The composition for forming an underlayer film according to any one of [1] to [9],
in which the halogen-based solvent includes one or more kinds selected from the group consisting of methylene chloride and chloroform.

[11]
A resist pattern forming method comprising:
forming an underlayer film on a substrate by using the composition for forming an underlayer film according to any one of [1] to [10];
forming a resist film on the underlayer film by using a resist composition;
exposing the resist film; and
developing the exposed resist film with a developer to form a resist pattern.

[12]
A resist pattern forming method comprising:
forming a second underlayer film on a substrate by using a composition for forming a second underlayer film, which includes an aromatic ring-containing compound;
forming an underlayer film on the second underlayer film by using the composition for forming an underlayer film according to any one of [1] to [10];
forming a resist film on the underlayer film by using a resist composition;
exposing the resist film; and
developing the exposed resist film with a developer to form a resist pattern.

[13]
The resist pattern forming method according to [11] or [12],
in which the exposure is a liquid immersion exposure.

[14]
The resist pattern forming method according to any one of [11] to [13],
in which the developer is a developer including an organic solvent.

[15]
The resist pattern forming method according to any one of [11] to [13],
in which the developer is an alkali developer.

[16]
A manufacturing method of an electronic device, comprising:
the resist pattern forming method according to any one of [11] to [15].

According to the present invention, it is possible to provide a composition for forming an underlayer film, with which an underlayer film having excellent surface flatness and solvent resistance can be formed.

In addition, it is possible to provide a resist pattern forming method and a manufacturing method of an electronic device, which are related to the composition for forming an underlayer film.

DESCRIPTION OF THE PREFERRED EMBODIMENTS

Hereinafter, an example of forms for carrying out the present invention will be described.

In the present specification, the numerical value range indicated by using "to" means a range including the numerical values before and after "to" as the lower limit value and the upper limit value, respectively.

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

The substituent is intended as a monovalent substituent unless otherwise specified.

An "organic group" in the present specification refers to a group including at least one carbon atom.

In the present specification, examples of the halogen atom include a fluorine atom, a chlorine atom, a bromine atom, and an iodine atom.

"(Meth)acryl" in the present specification is a generic term encompassing acryl and methacryl, and means "at least one of acryl or methacryl". Similarly, "(meth)acrylic acid" means "at least one of acrylic acid or methacrylic acid".

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. In the present specification, the term "light" means an actinic ray or a radiation.

Unless otherwise specified, "exposure" in the present specification encompasses not only exposure by a bright line spectrum of a mercury lamp, far ultraviolet rays typified by an excimer laser (ArF excimer laser and the like), extreme ultraviolet rays, X-rays, EUV light, or the like, but also drawing by particle beams such as electron beams and ion beams.

1 Å is $1 \times 10^{-10}$ m.

[Composition for Forming Underlayer Film]

A composition for forming an underlayer film according to an embodiment of the present invention is a composition for forming an underlayer film, which is used for forming an underlayer film under a resist film, the composition including a silicon atom-containing compound and a halogen-based solvent, in which a content of the halogen-based solvent is 1.0 ppb by mass to 50.0 ppm by mass with respect to a total mass of the composition for forming an underlayer film.

The mechanism capable of solving the above-described problems by adopting such a configuration of the composition for forming an underlayer film is not always clear, but the present inventors speculate as follows.

That is, since the composition for forming an underlayer film according to the embodiment of the present invention includes a certain amount or more of the halogen-based solvent, it is presumed that the silicon atom-containing compound and the like can be satisfactorily dispersed in the composition for forming an underlayer film, and in a case of forming the underlayer film, it is difficult to form irregularities derived from aggregates of the silicon atom-containing compound and the like.

On the other hand, since the content of the halogen-based solvent is a certain amount or less, it is presumed that the halogen-based solvent does not easily remain in the underlayer film, and in a case where the underlayer film comes into content with a solvent, dissolution of the underlayer film due to the presence of the halogen-based solvent in the underlayer film is less likely to occur, so that the underlayer film has excellent solvent resistance.

Hereinafter, the fact that the underlayer film formed of the composition for forming an underlayer film according to the embodiment of the present invention has excellent solvent resistance and/or surface flatness is also referred to as that the effects of the present invention are excellent.

[Silicon Atom-Containing Compound]

The composition for forming an underlayer film according to the embodiment of the present invention includes a silicon atom-containing compound.

The silicon atom-containing compound may be any compound including a silicon atom, and a compound including a siloxane bond (siloxane compound) is preferable.

The siloxane compound may be a polysiloxane.

In addition, as the silicon atom-containing compound, a silane compound represented by General Formula (i) described later, a silane compound other than the silane compound represented by General Formula (i) described later, and/or an oligomer of these compounds may be included.

<Polysiloxane>

The polysiloxane is a form of the siloxane compound.

The polysiloxane is not particularly limited as long as it is a polymer having a siloxane bond.

Among these, the polysiloxane is preferably a hydrolysis condensate of a silane compound represented by General Formula (i). The silane compound used for the synthesis of the polysiloxane may be used alone or in combination of two or more kinds thereof.

Here, the "hydrolysis condensate" means a hydrolysis condensate in which a part of silanol groups of a hydrolyzed silane compound is condensed with each other.

$$R^A_a SiX_{4-a} \quad (i)$$

In General Formula (i), $R^A$ represents a hydrogen atom or a monovalent organic group.

X represents a halogen atom or —$OR^B$.

$R^B$ represents a monovalent organic group.

a represents an integer of 0 to 3.

In a case where there are a plurality of $R^A$'s, the plurality of $R^A$'s may be the same or different from each other. In a case where there are a plurality of X's, the plurality of X's may be the same or different from each other.

The above-described monovalent organic group in $R^A$ or $R^B$ is preferably a monovalent organic group having 1 to 20 carbon atoms. Examples of the monovalent organic group having 1 to 20 carbon atoms include a monovalent hydrocarbon group, a group including a heteroatom-containing group between carbons of the hydrocarbon group, and a group in which a part or all of hydrogen atoms in these groups are substituted with substituents.

Examples of the above-described monovalent hydrocarbon group include a chain hydrocarbon group, an alicyclic hydrocarbon group, an aromatic hydrocarbon group, and a combination of these groups.

Examples of the above-described chain hydrocarbon group include alkyl groups such as a methyl group, an ethyl group, a propyl group, and a butyl group; alkenyl groups such as an ethenyl group, a propenyl group, and a butenyl group; and alkynyl groups such as an ethynyl group, a propynyl group, and a butynyl group.

Examples of the above-described alicyclic hydrocarbon group include cycloalkyl groups such as a cyclopropyl group, a cyclopentyl group, a cyclohexyl group, a norbornyl group, and an adamantyl group; and cycloalkenyl groups such as a cyclopropenyl group, a cyclopentenyl group, a cyclohexenyl group, and a norbornenyl group.

Examples of the above-described aromatic hydrocarbon group include aryl groups such as a phenyl group, a tolyl group, a xylyl group, a naphthyl group, and an anthryl group; and aralkyl groups such as a benzyl group, a phenethyl group, and a naphthylmethyl group.

The above-described heteroatom-containing group refers to, for example, a group having a divalent or higher valent heteroatom in the structure. The above-described heteroatom-containing group may have one heteroatom or two or more heteroatoms.

The divalent or higher heteroatom included in the above-described heteroatom-containing group is not particularly limited as long as it is a heteroatom having a divalent or higher valence, and examples thereof include an oxygen atom, a nitrogen atom, a sulfur atom, a silicon atom, a phosphorus atom, and a boron atom.

Examples of the above-described heteroatom-containing group include groups consisting of only heteroatoms, such as —SO—, —$SO_2$—, —$SO_2O$—, and —$SO_3$—; and groups of a combination of carbon atom and heteroatom, such as —CO—, —COO—, —COS—, —CONH—, —OCOO—, —OCOS—, —OCONH—, —SCONH—, —SCSNH—, and —SCSS—.

Examples of the above-described substituent include a halogen atom, a hydroxyl group, a carboxyl group, a nitro group, and a cyano group.

a is preferably an integer of 0 to 2, and more preferably 1 or 2.

Examples of the above-described silane compound represented by General Formula (i) include allyltriethoxysilanes such as methyltrimethoxysilane, methyltriethoxysilane, ethyltrimethoxysilane, ethyltriethoxysilane, and methyltris(dimethylsiloxy)silane; alkoxytrialkoxysilanes such as vinyltrimethoxysilane, vinyltriethoxysilane, allyltrimethoxysilane, and allyltriethoxysilane; aryltrialkoxysilanes such as phenyltrimethoxysilane; aryltrialkoxysilanes in which one or more hydrogen atoms on an aromatic ring are substituted with an alkyl group, a hydroxyl group, an alkoxy group, an amino group, or an alkylcarbonyloxy group, such as 4-methylphenyltrimethoxysilane; aralkyltrialkoxysilanes; tetraalkoxysilanes such as tetramethoxysilane, tetraethoxysilane, tetra-n-propoxysilane, tetra-iso-propoxysilane, tetra-n-butoxysilane, tetra-sec-butoxysilane, and tetra-t-butoxysilane; tetraarylsilanes such as tetraphenoxysilane; epoxy group-containing silanes such as oxetanyltrimethoxysilane, oxylanyltrimethoxysilane, oxylanylmethyltrimethoxysilane, and 3-glycidyloxypropyltrimethoxysilane; acid anhydride group-containing silanes such as 3-(trimethoxysilyl)propyl succinic acid anhydride, 2-(trimethoxysilyl)ethyl succinic acid anhydride, 3-(trimethoxysilyl)propyl maleic acid anhydride, and 2-(trimethoxysilyl)ethyl glutaric acid anhydride; and tetrahalosilanes such as tetrachlorosilane.

A silane compound other than the silane compound represented by General Formula (i) can also be used for the synthesis of the polysiloxane. Examples of such a silane compound include disilanes such as hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1-(dimethoxymethylsilyl)-1-(trimethylsilyl)methane, 1-(diethoxymethylsilyl)-1-(trimethylsilyl)methane, bis(trimethoxysilyl)benzene, and bis(triethoxysilyl)benzene; and polycarbosilanes such as polydimethoxymethylcarbosilane and polydiethoxymethylcarbosilane.

A content of the repeating unit derived from the compound represented by General Formula (i) in the silicon atom-containing compound (preferably, the siloxane compound) is preferably 50% to 100% by mass, more preferably 75% to 100% by mass, and still more preferably 90% to 100% by mass with respect to a total mass of the silicon atom-containing compound (preferably, the siloxane compound).

Among these, it is preferable that the silicon atom-containing compound (preferably, the siloxane compound) is a hydrolysis condensate (also referred to as a specific siloxane) of one or more compounds selected from the group consisting of tetramethoxysilane, tetraethoxysilane, tetra-n-propoxysilane, tetra-iso-propoxysilane, tetraphenoxysilane, and a compound represented by General Formula (A) (collectively referred to as a specific silane compound).

$$R^1{}_nSi(OR^2)_{4-n} \quad (A)$$

In General Formula (A), $R^1$ and $R^2$ each independently represent a monovalent organic group. n represents an integer of 1 to 3. Examples of the monovalent organic group of $R^1$ and $R^2$ include the same monovalent organic group as in the examples of $R^A$ or $R^B$.

The specific silane compound may be used alone, or two or more thereof may be used in combination.

The fact that the specific siloxane is a hydrolysis condensate of the specific silane compound means that the specific siloxane is a hydrolysis condensate in which a main component is a repeating unit corresponding to the specific silane compound. Specifically, a content of the repeating unit corresponding to one or more of the above-described compounds in the specific siloxane is preferably 60% to 100% by mass, more preferably 80% to 100% by mass, and still more preferably 90% to 100% by mass with respect to the total mass of the specific siloxane.

A lower limit of a weight-average molecular weight (Mw) of the siloxane compound (preferably, the specific siloxane) is, for example, 250 or more, preferably 500 or more, more preferably 800 or more, still more preferably 1,000 or more, and particularly preferably 1,200 or more. On the other hand, an upper limit of the Mw is preferably 20,000 or less, more preferably 15,000 or less, still more preferably 10,000 or less, and particularly preferably 5,000 or less.

In the present specification, the Mw of the siloxane compound is a value measured by a gel permeation chromatography (GPC) with monodisperse polystyrene as standard using GPC columns (two G2000HXL, one G3000HXL, and one G4000HXL) under analysis conditions of a flow rate of 1.0 mL/min, an elution solvent of tetrahydrofuran, and a column temperature of 40° C.

A content of the silicon atom-containing compound (preferably, the siloxane compound, and more preferably, the specific siloxane) in the composition for forming an underlayer film is preferably 80% to 100% by mass, more preferably 90% to 99.9% by mass, and still more preferably 94% to 99.5% by mass with respect to the total solid content of the composition for forming an underlayer film.

In the present specification, the solid content is a material for forming the underlayer film, and is intended to be all components other solvent components (halogen-based solvent and non-halogen-based solvent) described later, in which a liquid component is regarded as the solid content. The solid content may be chemically changed from a state included in the composition for forming an underlayer film immediately before a timing of forming the underlayer film.

One kind of the silicon atom-containing compound may be used singly, or two or more kinds thereof may be used.

As a method for hydrolyzing and condensing the silane compound represented by General Formula (i) and the other silane compounds used as needed, a known method for hydrolysis and condensation can be used.

<Halogen-Based Solvent>

The composition for forming an underlayer film according to the embodiment of the present invention includes a halogen-based solvent.

The halogen-based solvent is a liquid compound at normal temperature (25° C.), which includes a halogen atom (F, Cl, Br, I, and the like). However, the halogen-based solvent is a solvent other than the silicon atom-containing compound.

In addition, it is also preferable that the halogen-based solvent is a halogen-based organic solvent (halogen-based solvent having at least one (preferably 1 to 10) carbon atom).

Examples of the halogen-based solvent include chlorine-based solvents such as chloroform, o-dichlorobenzene, m-dichlorobenzene, p-dichlorobenzene, 1,1-dichloroethane, 1,2-dichloroethane, 1,1,1-trichloroethane, 1,1,2-trichloroethane, carbon tetrachloride, trichloroethylene, and perchloroethylene; bromide-based solvents such as ethane bromide; fluorine-based solvents such as monofluorobenzene, 1,4-difluorobenzene, perfluoroheptane, perfluorooctane, benzotrifluoride, and dichloropentafluoropropane; and solvents including two or more halogen atoms, such as bromochloromethane and 1,2-dibromo-1,1-difluoroethane.

Among these, the halogen-based solvent preferably includes one or more kinds selected from the group consisting of methylene chloride and chloroform.

A content of the halogen-based solvent (preferably, methylene chloride and/or chloroform) is 1.0 ppb by mass to 50.0 ppm by mass, preferably 50.0 ppb by mass to 20.0 ppm by mass and more preferably 1.0 to 10.0 ppm by mass with respect to the total mass of the composition for forming an underlayer film.

In addition, the content of the halogen-based solvent (preferably, methylene chloride and/or chloroform) is preferably 5 ppb by mass to 1000 ppm by mass, more preferably 20 ppb by mass to 750 ppm by mass, and still more preferably 500 ppb by mass to 100 ppm by mass with respect to the total mass of the silicon atom-containing compound (preferably, the siloxane compound, and more preferably, the specific siloxane).

One kind of the halogen-based solvent may be used singly, or two or more kinds thereof may be used.

The type and content of the halogen-based solvent included in the composition for forming an underlayer film can be measured by, for example, the following method.

That is, first, using a heating adsorption device (manufactured by Markes International Ltd., M-CTE250), the solvent component in a sample (composition for forming an underlayer film) heated and vaporized at a heating temperature of 200° C., and adsorbed on a sample tube. Next, using a heat desorption device (manufactured by GL Sciences Inc., HandyTD TD265), the solvent component adsorbed on the sample tube is desorbed at a heating temperature of 200° C., and quantitative analysis of the desorbed solvent component with a gas chromatograph mass spectrometer (manufactured by JEOL Ltd., JMS-Q1500GC) to measure the type and content of the halogen-based solvent included in the composition for forming an underlayer film.

In addition, in a case where a formulation of the composition for forming an underlayer film is known, the type and content of the halogen-based solvent included in the composition for forming an underlayer film may be determined by calculation from the formulation amount.

<Acid Generator, Basic Compound, and Acidic Compound>

The composition for forming an underlayer film according to the embodiment of the present invention preferably includes one or more compounds selected from the group consisting of an acid generator, a basic compound, and an acidic compound, and more preferably includes an acid generator.

(Acid Generator)

The acid generator may be a photoacid generator which generates acid in a case of being irradiated with light, may be a thermal acid generator by heating, or may have properties of both photoacid generator and thermal acid generator.

Among these, the acid generator is preferably a photoacid generator.

In a case where an acid is generated from the acid generator, crosslinking between molecular chains of the siloxane compounds and the like can be promoted, and a shape of the resist pattern formed on the underlayer film can be improved.

The acid generator preferably includes a cation (onium cation) and an anion (acid anion).

The above-described cation preferably includes at least one of an alicyclic structure, an aliphatic heterocyclic structure, or an aromatic ring structure having a chain substituent.

Examples of the above-described alicyclic structure include monocyclic cycloalkane structures such as a cyclopropane structure, a cyclobutane structure, a cyclopentane structure, and a cyclohexane structure; and polycyclic cycloalkane structures such as a norbornane structure and an adamantane structure.

Examples of the above-described aliphatic heterocyclic structure include monocyclic structures such as an oxirane structure, an oxetane structure, an oxolane structure, a thiolane structure, and a thiane structure; and polycyclic structures such as an oxanorbornane structure, an azanorbornane structure, a thianorbornane structure, a norbornane lactone structure, an oxanorbornane lactone structure, and a norbornane sultone structure.

Examples of the above-described aromatic ring structure having a chain substituent include structures in which a part or all of hydrogen atoms of an aromatic ring structure are substituted with chain hydrocarbon groups.

Examples of the above-described aromatic ring structure include a benzene structure, a naphthalene structure, an anthracene structure, and a phenalene structure.

Examples of the above-described chain hydrocarbon group include alkyl groups such as a methyl group, an ethyl group, a propyl group, and a butyl group; alkenyl groups such as an ethenyl group, a propenyl group, and a butenyl group; and alkynyl groups such as an ethynyl group, a propynyl group, and a butynyl group.

The above-described cation is preferably a cation represented by any one of General Formula (C1), (C2), or (C3).

(C1)

(C2)

(C3)

In General Formulae (C1) to (C3), $R_{11}$ to $R_{14}$, $R_{21}$ to $R_{23}$, $R_{31}$, and $R_{32}$ each independently represent an alkyl group or an aryl group.

The number of carbon atoms in the above-described alkyl group is preferably 1 to 10. The above-described alkyl groups may be any of a primary alkyl group, a secondary alkyl group, or a tertiary alkyl group, respectively, and a primary alkyl group or a secondary alkyl group is preferable.

Examples of the above-described alkyl group include a methyl group, an ethyl group, an n-propyl group (n-propyl group and isopropyl group), and a butyl group (n-butyl group, sec-butyl group, isobutyl group, and tert-butyl group), which may have a substituent.

The above-described alkyl group may be used singly or in combination of two or more kinds thereof.

As the above-described aryl group, an aryl group having 6 to 15 carbon atoms is preferable, a phenyl group or a naphthyl group is more preferable, and a phenyl group is still more preferable.

The substituent which may be included in the above-described alkyl group and the above-described aryl group is not limited, and examples thereof include an organic group (the same group as the monovalent organic group of $R^A$ or $R^B$ in General Formula (i) described above). Among these, an alicyclic hydrocarbon group is preferable, a cycloalkyl group is more preferable, and a cyclohexyl group is still more preferable.

The above-described alkyl group and the above-described aryl group may be unsubstituted.

One kind of each of the above-described alkyl groups and the above-described aryl groups may be used singly, or two or more kinds thereof may be used.

In General Formula (C2), two of $R_{21}$ to $R_{23}$ may be bonded to each other to form a ring.

In a case where two of $R_{21}$ to $R_{23}$ are bonded to each other to form a ring, a ring skeleton may include a heteroatom such as an oxygen atom and a nitrogen atom. In one aspect, it is preferable that two of $R_{21}$ to $R_{23}$ are bonded to each other to form a ring, and two of $R_{21}$ to $R_{23}$ are jointly bonded to form an alkylene group (preferably having 3 to 7 carbon atoms) with both ends bonded to S$^+$. In a case where two of $R_{21}$ to $R_{23}$ are bonded to each other to form a ring, it is also preferable that the remaining one of $R_{21}$ to $R_{23}$ is the above-described aryl group.

The above-described cation may be an onium cation represented by General Formula (ZaI-4b).

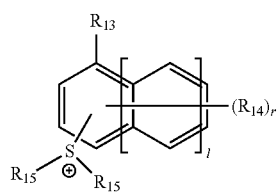

(ZaI-4b)

In General Formula (ZaI-4b), l represents an integer of 0 to 2.

r represents an integer of 0 to 8.

$R_{13}$ represents a hydrogen atom, a fluorine atom, a hydroxyl group, an alkyl group, an alkoxy group, an alkoxycarbonyl group, or a group having a cycloalkyl group (which may be the cycloalkyl group itself or a group including the cycloalkyl group in a part thereof). These groups may have a substituent.

$R_{14}$ represents a hydroxyl group, an alkyl group, an alkoxy group, an alkoxycarbonyl group, an alkylcarbonyl group, an alkylsulfonyl group, a cycloalkylsulfonyl group, or a group having a cycloalkyl group (which may be the cycloalkyl group itself or a group including the cycloalkyl group in a part thereof). These groups may have a substituent. In a case where $R_{14}$'s are present in a plural number, $R_{14}$'s each independently represent the group such as a hydroxyl group.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, a ring skeleton may include a heteroatom such as an oxygen atom and a nitrogen atom. In one aspect, it is preferable that two $R_{15}$'s are bonded to each other to form a ring, and two $R_{15}$'s are jointly bonded to form an alkylene group (preferably having 3 to 7 carbon atoms) with both ends bonded to S$^+$.

In General Formula (ZaI-4b), the alkyl groups of $R_{13}$, $R_{14}$, and $R_{15}$ are linear or branched. The number of carbon atoms in the alkyl group is preferably 1 to 10. As the alkyl group, a methyl group, an ethyl group, an n-butyl group, or a t-butyl group is more preferable.

Examples of the above-described anion include an oxoacid anion and a sulfonylimide acid anion. Examples of the oxoacid anion include a sulfonate anion, a carboxylate anion, and a phosphonate anion. Among these, from the viewpoint of strength of the generated acid, a sulfonate anion is preferable.

As the above-described sulfonate anion, an anion represented by General Formula (2-a) is preferable.

(2-a)

In General Formula (2-a), R$^3$ represents a monovalent organic group and is preferably a monovalent organic group having 1 to 20 carbon atoms.

Examples of the organic group of R$^3$ include the same group as the monovalent organic group of R$^A$ or R$^B$ in General Formula (i) described above.

Among these, as R$^3$, a hydrocarbon group having a halogen atom is preferable, a hydrocarbon group having a fluorine atom is more preferable, a hydrocarbon group which has 1 to 6 carbon atoms and has a fluorine atom is still more preferable, and a hydrocarbon group which has 4 to 6 carbon atoms and has a fluorine atom is particularly preferable.

Among these, the sulfonate anion is more preferably an anion represented by General Formula (A1).

(A1)

In General Formula (A1), Rf represents an organic group having one or more fluorine atoms. Examples of the organic group in the above-described organic group having one or more fluorine atoms include the same group as the monovalent organic group of R$^A$ or R$^B$ in General Formula (i) described above.

Among these, the number of fluorine atoms included in the above-described organic group having one or more fluorine atoms is preferably 1 to 20 and more preferably 2 to 12.

In addition, as the above-described sulfonylimide acid anion, an anion represented by General Formula (2-b) is preferable.

(2-b)

In General Formula (2-b), L is an alkylene group having 2 to 6 carbon atoms, in which at least one hydrogen atom is substituted with a fluorine atom (hereinafter, also referred to as a "fluorinated alkylene group").

The number of carbon atoms in the above-described fluorinated alkylene group is preferably 3, 4, or 5, and more preferably 3. In a case where the number of carbon atoms is the above-described numerical value, elution of the composition for forming an underlayer film into water can be reduced.

In addition, a lower limit of a fluorination rate which is a proportion of hydrogen atoms included in the above-described fluorinated alkylene group to atoms substituted with the fluorine atom is preferably 70 mol % and more preferably 90 mol %. On the other hand, an upper limit of the above-described fluorination rate is preferably 100 mol %. In a case where the fluorination rate is within the above-described range, strength of the acid generated from the acid generator is appropriately adjusted.

As the above-described fluorinated alkylene group, a perfluoroalkylene alkylene group in which all hydrogen atoms of the alkylene group are substituted with fluorine atoms is preferable.

Examples of the above-described fluorinated alkylene group include a tetrafluoroethylene group, a 1,2-hexafluoropropylene group, a 1,3-hexafluoropropylene group, a 1,2-octafluorobutylene group, a 1,3-octafluorobutylene group, a 1,4-octafluorobutylene group, a 2-trifluoromethyl-1,3-pentafluoropropylene group, a 1,5-perfluoropentylene group, a 1,6-perfluorohexylene group, a 1,7-perfluoroheptylene group, and a 1,8-perfluorooctylene group.

In addition, as the above-described anion represented by General Formula (2-b), anions represented by General Formulae (2-b-1) to (2-b-3) are preferable.

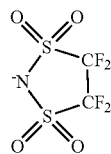

(2-b-1)

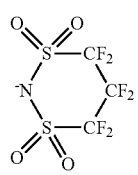

(2-b-2)

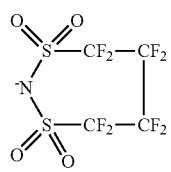

(2-b-3)

Among these, the acid generator is preferably a compound represented by any one of General Formula (1), (2), or (3).

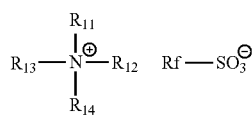

(1)

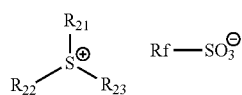

(2)

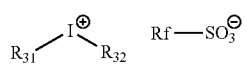

(3)

In General Formulae (1) to (3), $R_{11}$ to $R_{14}$, $R_{21}$ to $R_{23}$, $R_{31}$, and $R_{32}$ each independently represent an alkyl group or an aryl group. Rf represents an organic group having one or more fluorine atoms. In General Formula (2), two of $R_{21}$ to $R_{23}$ may be bonded to each other to form a ring.

The cations in General Formulae (1) to (3) correspond to the cations represented by General Formulae (C1) to (C3), respectively.

The anions in General Formulae (1) to (3) correspond to the anion represented by General Formula (A1).

As a lower limit of the sum of atomic weights of the atoms constituting the anion, 150 or more is preferable, 180 or more is more preferable, and 190 or more is still more preferable. On the other hand, as an upper limit of the sum of atomic weights described above, 350 or less is preferable, 320 or less is more preferable, and 300 or less is still more preferable. In a case where the sum of atomic weights described above is within the above-described range, a diffusion length of the acid generated from the acid generator tends to be within an appropriate range.

As the acid generator in the composition for forming an underlayer film, a photoacid generator which can be included in a resist composition described later can also be used in the same manner.

In addition, as the cation of the acid generator in the composition for forming an underlayer film, a cation in the photoacid generator which can be included in the resist composition described later can also be used in the same manner.

In addition, as the anion of the acid generator in the composition for forming an underlayer film, an anion in the photoacid generator which can be included in the resist composition described later can also be used in the same manner.

The acid generator is shown below.

In addition, an acid generator in which the cation and the anion used in the following acid generators are appropriately modified may be used.

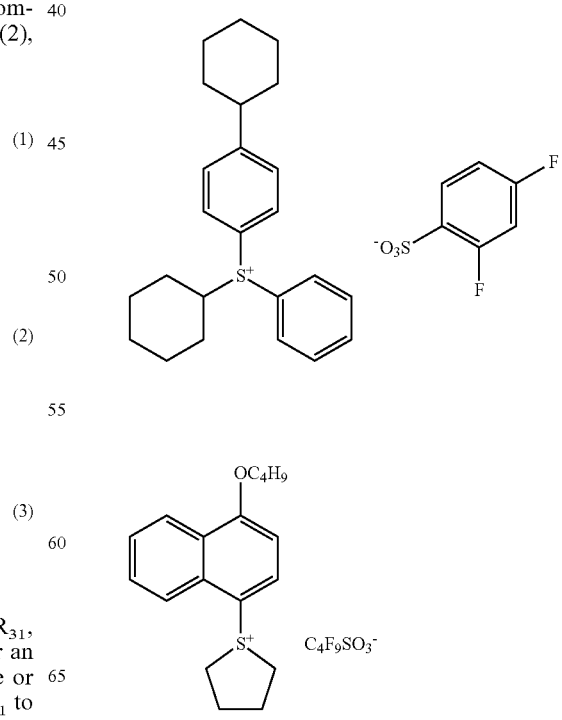

-continued

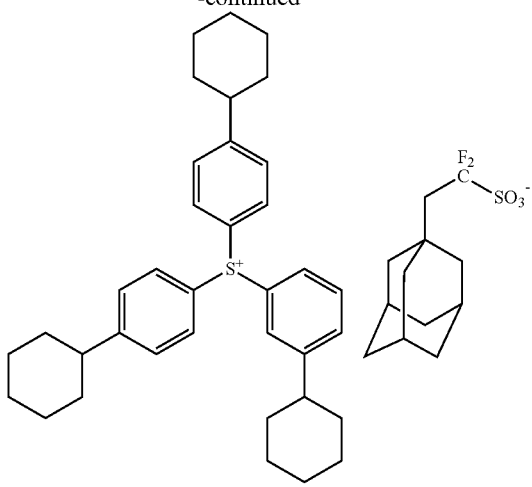

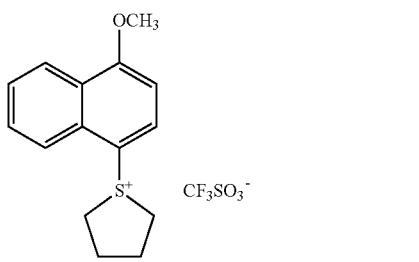

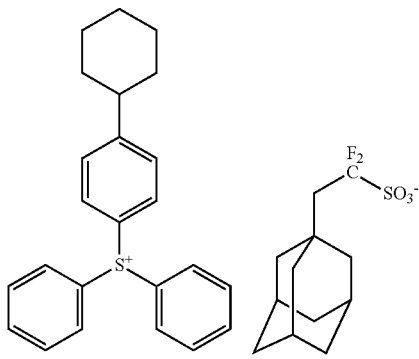

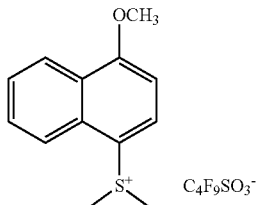

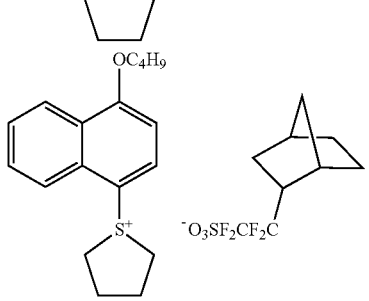

-continued

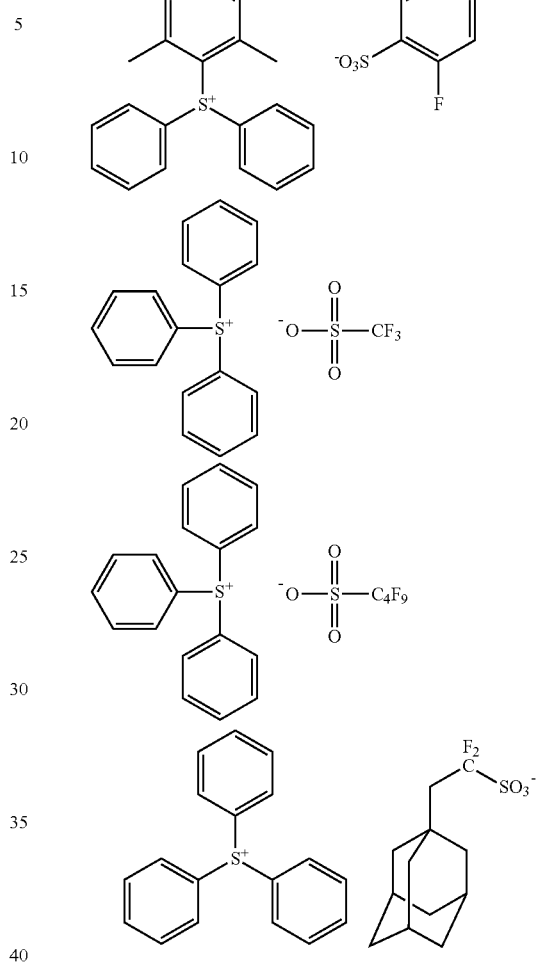

A content of the acid generator is preferably 0.5 to 20 parts by mass and more preferably 1.0 to 10 parts by mass with respect to 100 parts by mass of the silicon atom-containing compound (preferably, the siloxane compound, and more preferably, the specific siloxane).

The acid generator may be used singly or in combination of two or more kinds thereof.

(Basic Compound)

The composition for forming an underlayer film according to the embodiment of the present invention may include a basic compound.

As the basic compound, compounds having structures represented by General Formula (A) to General Formula (E) are preferable.

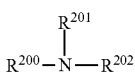 (A)

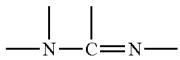 (B)

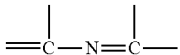 (C)

-continued

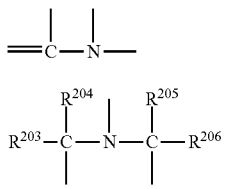

(D)

(E)

In General Formula (A) and General Formula (E), $R^{200}$, $R^{201}$, and $R^{202}$ may be the same or different from each other, and each represents a hydrogen atom, an alkyl group (preferably having 1 to 20 carbon atoms), a cycloalkyl group (preferably having 3 to 20 carbon atoms), or an aryl group (preferably having 6 to 20 carbon atoms), in which $R^{201}$ and $R^{202}$ may be bonded to each other to form a ring.

With regard to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same or different from each other, and each represents an alkyl group having 1 to 20 carbon atoms.

It is more preferable that the alkyl groups in General Formula (A) and General Formula (E) are unsubstituted.

As the basic compound, guanidine, aminopyrrolidine, pyrazole, pyrazoline, piperazine, aminomorpholine, aminoalkylmorpholine (alkyl group moiety may be linear or branched and may be partially substituted with an ether group and/or an ester group; total number of all atoms other than hydrogen atoms of the alkyl group moiety is preferably 1 to 17), piperidine, or the like is preferable. Among these, a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; an aniline derivative having a hydroxyl group and/or an ether bond; or the like is more preferable.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group. Specific examples thereof include triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, tris(methoxyethoxyethyl)amine, and $(HO-C_2H_4-O-C_2H_4)_2N(-C_3H_6-O-CH_3)$. Examples of the aniline derivative having a hydroxyl group and/or an ether bond include N,N-bis(hydroxyethyl)aniline.

Preferred examples of the basic compound include an amine compound having a phenoxy group and an ammonium salt compound having a phenoxy group.

As the amine compound, for example, a primary, secondary, or tertiary amine compound can be used, and an amine compound in which at least one alkyl group is bonded to a nitrogen atom is preferable. The amine compound is more preferably a tertiary amine compound. In the amine compound, in addition to the alkyl group, a cycloalkyl group (preferably having 3 to 20 carbon atoms) or an aryl group (preferably having 6 to 12 carbon atoms) may be bonded to the nitrogen atom as long as at least one alkyl group (preferably having 1 to 20 carbon atoms) is bonded to the nitrogen atom.

In addition, the amine compound preferably has an oxyalkylene group. The number of oxyalkylene groups in the molecule is preferably 1 or more, more preferably 3 to 9, and still more preferably 4 to 6. Among oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

Examples of the ammonium salt compound include primary, secondary, tertiary, and quaternary ammonium salt compounds, and an ammonium salt compound in which at least one alkyl group is bonded to a nitrogen atom is preferable. In the ammonium salt compound, in addition to the alkyl group, a cycloalkyl group (preferably having 3 to 20 carbon atoms) or an aryl group (preferably having 6 to 12 carbon atoms) may be bonded to the nitrogen atom as long as at least one alkyl group (preferably having 1 to 20 carbon atoms) is bonded to the nitrogen atom.

It is preferable that the ammonium salt compound has an oxyalkylene group. The number of oxyalkylene groups in the molecule is preferably 1 or more, more preferably 3 to 9, and still more preferably 4 to 6. Among oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

Examples of the anion of the ammonium salt compound include a halogen atom, a sulfonate, a borate, and a phosphate, and among these, a halogen atom or a sulfonate is preferable. As the halogen atom, a chlorine atom, a bromine atom, or an iodine atom is preferable. As the sulfonate, an organic sulfonate having 1 to 20 carbon atoms is preferable. Examples of the organic sulfonate include an alkyl sulfonate and aryl sulfonate, having 1 to 20 carbon atoms. The alkyl group of the alkyl sulfonate may have a substituent, and examples of the substituent include a fluorine atom, a chlorine atom, a bromine atom, an alkoxy group, an acyl group, and an aromatic ring group. Examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate. Examples of the aryl group of the aryl sulfonate include a benzene ring group, a naphthalene ring group, and an anthracene ring group. As the substituent which can be included in the benzene ring group, the naphthalene ring group, and the anthracene ring group, a linear or branched alkyl group having 1 to 6 carbon atoms or a cycloalkyl group having 3 to 6 carbon atoms is preferable. Examples of the linear or branched alkyl group and the cycloalkyl group include a methyl group, an ethyl group, an n-propyl group, an isopropyl group, an n-butyl group, an i-butyl group, a t-butyl group, an n-hexyl group, and a cyclohexyl group. Examples of other substituents include an alkoxy group having 1 to 6 carbon atoms, a halogen atom, a cyano group, a nitro group, an acyl group, and an acyloxy group.

The amine compound having a phenoxy group and the ammonium salt compound having a phenoxy group are each a compound having a phenoxy group at the terminal on the opposite side to the nitrogen atom of the alkyl group which is contained in the amine compound or the ammonium salt compound.

Examples of a substituent of the phenoxy group include an alkyl group, an alkoxy group, a halogen atom, a cyano group, a nitro group, a carboxylic acid group, a carboxylic ester group, a sulfonic ester group, an aryl group, an aralkyl group, an acyloxy group, and an aryloxy group. The substitution position of the substituent may be any of 2- to 6-positions. The number of the substituents may be any one of 1 to 5.

The compound preferably has at least one oxyalkylene group between the phenoxy group and the nitrogen atom. The number of oxyalkylene groups in the molecule is preferably 1 or more, more preferably 3 to 9, and still more preferably 4 to 6. Among oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The amine compound having a phenoxy group can be obtained by heating a mixture of a primary or secondary amine having a phenoxy group and a haloalkyl ether to perform a reaction, then adding an aqueous solution of a strong base (for example, sodium hydroxide, potassium hydroxide, and tetraalkylammonium) to a reaction system, and extracting the reaction product with an organic solvent (for example, ethyl acetate and chloroform).

Alternatively, the amine compound having a phenoxy group can also be obtained by heating a mixture of a primary or secondary amine and a haloalkyl ether having a phenoxy group at the terminal to perform a reaction, then adding an aqueous solution of a strong base to the reaction system, and extracting the reaction product with an organic solvent.

A content of the basic compound is preferably 0.1% to 20% by mass with respect to the total solid content of the composition for forming an underlayer film.

(Acidic Compound)

The composition for forming an underlayer film according to the embodiment of the present invention may include an acidic compound.

The acidic compound may be an organic acid or an inorganic acid.

Examples of the above-described organic acid include sulfonic acid compounds and carboxylic acid compounds, such as p-toluene sulfonic acid, trifluoromethane sulfonic acid, pyridinium-p-toluene sulfonate, salicylic acid, camphor sulfonic acid, 5-sulfosalicylic acid, 4-chlorobenzene sulfonic acid, 4-hydroxybenzene sulfonic acid, benzene disulfonic acid, 1-naphthalene sulfonic acid, citric acid, benzoic acid, and hydroxybenzoic acid.

Examples of the inorganic acid include hydrochloric acid, sulfuric acid, nitric acid, and phosphoric acid.

The acidic compound may be used singly or in combination of two or more kinds thereof.

A content of the acidic compound is preferably 0.1% to 20% by mass with respect to the total solid content of the composition for forming an underlayer film.

<Solvent>

The composition for forming an underlayer film may include a solvent.

The solvent referred to here is a non-halogen-based solvent different from the above-described halogen-based solvent.

Examples of the solvent include an organic solvent and water.

(Organic Solvent)

Examples of the organic solvent include organic solvents such as an alcohol-based solvent, an ether-based solvent, a ketone-based solvent, an amide-based solvent, an ester-based solvent, and a hydrocarbon-based solvent.

Examples of the above-described alcohol-based solvent include aliphatic monoalcohol-based solvents having 1 to 18 carbon atoms, such as 4-methyl-2-pentanol and n-hexanol; alicyclic monoalcohol-based solvents having 3 to 18 carbon atoms, such as cyclohexanol; polyhydric alcohol-based solvents having 3 to 18 carbon atoms, such as 1,2-propylene glycol; and polyhydric alcohol-partially ether-based solvents having 3 to 19 carbon atoms, such as propylene glycol monoethyl ether.

Examples of the above-described ether-based solvent include dialiphatic ether solvents such as diethyl ether, dipropyl ether, and dibutyl ether; aromatic ring-containing ether-based solvents such as anisole and diphenyl ether, and cyclic ether-based solvents such as tetrahydrofuran and dioxane.

Examples of the above-described ketone-based solvent include chain ketone-based solvents such as acetone, methyl ethyl ketone, methyl-n-propyl ketone, methyl-n-butyl ketone, diethyl ketone, methyl-iso-butyl ketone, methyl-n-amyl ketone, ethyl-n-butyl ketone, methyl-n-hexyl ketone, di-iso-butyl ketone, trimethyl nonanone, and acetophenone; cyclic ketone-based solvents such as cyclopentanone, cyclohexanone, cycloheptanone, cyclooctanone, and methylcyclohexanone; and diketone-based solvents such as 2,4-pentandione and acetylacetone.

Examples of the above-described amide-based solvent include chain amide-based solvents such as N-methylformamide, N,N-dimethylformamide, N,N-diethylformamide, acetamide, N-methylacetamide, N,N-dimethylacetamide, and N-methylpropionamide; and cyclic amide-based solvents such as N-methylpyrrolidone and N,N'-dimethylimidazolidinone.

Examples of the above-described ester-based solvent include monocarboxylic acid ester solvents such as n-butyl acetate and ethyl lactate; lactone-based solvents such as γ-butyrolactone and valero lactone; polyhydric alcohol-partially ether carboxylate-based solvents such as propylene glycol monomethyl ether acetate; polyvalent carboxylic acid diester-based solvents such as diethyl oxalate; and carbonate-based solvents such as dimethyl carbonate and diethyl carbonate.

Examples of the above-described hydrocarbon-based solvent include aliphatic hydrocarbon-based solvents such as n-pentane, iso-pentane, n-hexane, iso-hexane, n-heptane, iso-heptane, 2,2,4-trimethylpentane, n-octane, iso-octane, cyclohexane, and methylcyclohexane; and aromatic hydrocarbon-based solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene, and n-amylnaphthalene.

Among these, as the organic solvent, an alcohol-based solvent, or an ester-based solvent is preferable, a polyhydric alcohol-partially ether-based solvent or a polyhydric alcohol monoalkyl ether acetate-based solvent is more preferable, and propylene glycol monoethyl ether or propylene glycol monomethyl ether acetate is still more preferable.

A content of the organic solvent is preferably 70% to 100% by mass, more preferably 90% to 100% by mass, and still more preferably 99% to 100% by mass with respect to the total mass of the solvent (non-halogen-based solvent).

One kind of the organic solvent may be used singly, or two or more kinds thereof may be used.

(Water)

The composition for forming an underlayer film may include water.

In a case where the composition for forming an underlayer film includes water, a content of the water is preferably 0.1% to 30% by mass, more preferably 0.2% to 20% by mass, and still more preferably 0.2% to 15% by mass with respect to the total mass of the composition for forming an underlayer film.

The content of the solvent is an amount in which a concentration of solid contents in the composition for forming an underlayer film is preferably 0.1% to 60% by mass, more preferably 0.5% to 20% by mass, and still more preferably 1% to 10% by mass.

<Method for Preparing Composition for Forming Underlayer Film>

A method for preparing the composition for forming an underlayer film is not limited, and for example, the composition for forming an underlayer film is obtained by mixing the silicon atom-containing compound, the halogen-based solvent, and optionally other components.

[Resist Pattern Forming Method]

A resist pattern forming method according to an embodiment of the present invention includes the following steps (P) to (S).

(P) step (underlayer film forming step) of forming an underlayer film on a substrate by using the composition for forming an underlayer film (Q) step (resist film forming step) of forming a resist film on the underlayer film by using a resist composition (R) step (exposing step) of exposing the resist film (S) step (developing step) of developing the exposed resist film with a developer to form a resist pattern In the step (P), the underlayer film may be formed directly on the substrate, or may be formed through other layers (a second underlayer film described later, and the like). That is, in the step (P), the underlayer film may be formed on other layers (a second underlayer film described later, and the like) formed on the substrate. As described above, it is assumed that the aspect in which the underlayer film is formed on the substrate includes the aspect in which the underlayer film is formed through other layers (a second underlayer film described later, and the like).

<Step P (Underlayer Film Forming Step)>

In the underlayer film forming step, the underlayer film is formed on the substrate by using the above-described composition for forming an underlayer film. Specific examples thereof include a method of applying the composition for forming an underlayer film to one surface side of the substrate to form a coating film.

In a case where the composition for forming an underlayer film includes the solvent, it is preferable to volatilize the solvent from the coating film to form the underlayer film.

The coating film may be subjected to a heating treatment as desired, so that the silicon atom-containing compound (preferably, the siloxane compound, and more preferably, the specific siloxane) is crosslinked by the heating treatment.

As the substrate, for example, a known substrate in the related art, such as a silicon wafer and a wafer coated with aluminum, can be used.

In addition, the substrate may be a stepped substrate. The stepped substrate is a substrate on which at least one stepped shape is formed.

In a case where the substrate is a stepped substrate, a film thickness of the underlayer film means a height from a bottom surface of the stepped substrate to an upper surface of the formed underlayer film.

For example, in an aspect of injecting ions into the substrate, as the stepped substrate, a substrate in which fins and/or gates are patterned on a flat substrate can be used. In a case where the underlayer film is formed on the stepped substrate on which the fins and/or gates are patterned, a film thickness of the formed underlayer film does not mean a height from an upper surface of the fins and gates to an upper surface of the formed underlayer film, but a height from a bottom surface of the stepped substrate to an upper surface of the formed underlayer film, as described above.

As the size (width, length, height, and the like), spacing, structure, configuration, and the like of the fins and gates, for example, the description in pages 25 to 29 of "Cutting-edge FinFET processing and integration technology" Journal of the institute of Electronics, Information and Communication Engineers Vol. 91 No. 1 2008, or Jpn. J. Appl. Phys. Vol. 42 (2003) pp. 4142-4146 Part 1 No. 6B June 2003 "Fin-Type Double-Gate Metal-Oxide-Semiconductor Field-Effect Transistors Fabricated by Orientation-Dependent Etching and Electron Beam Lithography" can be referred to.

Examples of the stepped substrate include a stepped substrate having a groove portion in which a groove width is an exposure wavelength or less (preferably 100 nm or less and more preferably 40 nm or less; usually 15 nm or more) and a depth is 200 nm or less (preferably 50 to 200 nm and more preferably 65 to 200 nm), and a stepped substrate having a cylindrical recess portion in which a diameter is an exposure wavelength or less (preferably 100 nm or less and more preferably 40 nm or less; usually 15 nm or more) and a depth is 100 nm or less (preferably 50 to 100 nm and more preferably 65 to 100 nm).

Examples of the stepped substrate having the above-described groove portion include a stepped substrate having a plurality of grooves repeatedly at equal intervals, for example, at a pitch of 20 to 200 nm (preferably 50 to 200 nm and more preferably 70 to 150 nm).

In addition, examples of the stepped substrate having the above-described cylindrical recess portion include a stepped substrate having a plurality of cylindrical recess portions repeatedly at equal intervals, for example, at a pitch of 20 to 200 nm (preferably 50 to 150 nm and more preferably 70 to 120 nm).

Examples of a method of applying the composition for forming an underlayer film include a spin coating, a cast coating, and a roll coating.

A lower limit of a film thickness (average film thickness) of the formed underlayer film is preferably 0.01 µm or more. On the other hand, an upper limit of the above-described film thickness (average film thickness) is preferably 1 µm or less and more preferably 0.5 µm or less.

After applying the composition for forming an underlayer film, the solvent in the coating film may be volatilized by pre-baking (PB) as desired, separately from a heating treatment described later. A temperature of PB is preferably 30° C. to 200° C. In addition, a time of PB is preferably 5 to 600 seconds.

A lower limit of a heating temperature in the heating treatment is preferably 100° C. or higher, more preferably 120° C. or higher, still more preferably 150° C. or higher, and particularly preferably 200° C. or higher. On the other hand, an upper limit of the heating temperature described above is preferably 450° C. or lower, more preferably 400° C. or lower, still more preferably 300° C. or lower, and particularly preferably 240° C. or lower.

A lower limit of a heating time in the heating treatment is preferably 10 seconds or more, more preferably 15 seconds or more, still more preferably 20 seconds or more, and particularly preferably 40 seconds or more. On the other hand, an upper limit of the heating time described above is preferably 1 hour or less, more preferably 10 minutes or less, still more preferably 150 seconds or less, and particularly preferably 80 seconds or less.

In addition, an atmosphere during the above-described heating treatment is not particularly limited, and the heating treatment may be performed under an air atmosphere or under an inert gas atmosphere of nitrogen gas and the like.

In addition, before the above-described underlayer film forming step, a second underlayer film may be formed on the substrate.

That is, before the step P (underlayer film forming step), as a step (O), a "step (second underlayer film forming step) of forming a second underlayer film on the substrate using a composition for forming a second underlayer film" may be included.

In the step (P) in this case, the underlayer film is formed on the second underlayer film. In other words, in the step (P) in this case, the underlayer film is formed on the substrate through the second underlayer film.

The second underlayer film is preferably an organic layer.

The second underlayer film is, for example, a spin on carbon (SOC) layer. The composition for forming a second underlayer film is, for example, a composition for forming the SOC layer.

The composition for forming a second underlayer film preferably includes an aromatic ring-containing compound, and is more preferably a composition capable of crosslinking the aromatic ring-containing compound by heating and/or exposing a coating film formed of the composition for forming a second underlayer film. It is also preferable that the above-described aromatic ring-containing compound is other than the silicon atom-containing compound.

Furthermore, it is also possible to form an organic antireflection film on the substrate, and then form the underlayer film and/or the second underlayer film thereon. As the organic antireflection film, for example, films described in JP1994-12452B (JP-H6-12452B), JP1984-93448A (JP-S59-93448A), and the like can be used.

<Step Q (Resist Film Forming Step)>

In the resist film forming step, a resist film is formed on the above-described underlayer film by using a resist composition.

The resist composition will be described later.

Examples of the method of forming the resist film on the substrate by using the resist composition include a method (coating method) in which the resist composition is applied to the underlayer film, and as necessary, a curing treatment is performed, and a method in which the resist film is formed on a temporary support, and the resist film is transferred to the substrate (to the underlayer film). Among these, from the viewpoint of excellent productivity, the coating method is preferable.

In the coating method, the resist composition can be applied by an appropriate coating method of a spinner, a coater, and the like. The coating method is preferably a spin coating using a spinner. A rotation speed in a case of the spin coating using a spinner is preferably 1000 to 3000 rpm.

After the application of the resist composition, the coating film of the resist composition may be dried to form the resist film.

Examples of a drying method include a method of performing drying by heating. The heating can be performed using a unit included in an ordinary exposure machine and/or development machine, or may also be performed using a hot plate or the like. A heating temperature is preferably 80° C. to 150° C., more preferably 80° C. to 140° C., and still more preferably 80° C. to 130° C. A heating time is preferably 30 to 1000 seconds, more preferably 60 to 800 seconds, and still more preferably 60 to 600 seconds.

A film thickness of the resist film is not particularly limited, but from the viewpoint that a more accurate fine pattern can be formed, the film thickness is preferably 1 to 1000 nm, more preferably 10 to 700 nm, and still more preferably 15 to 150 nm.

A topcoat may be formed on the upper layer of the resist film, using a topcoat composition.

It is preferable that the topcoat composition is not mixed with the resist film and can be uniformly applied to the upper layer of the resist film.

In addition, it is preferable that the resist film is dried before forming the topcoat. Subsequently, the topcoat composition is applied to the obtained resist film by the same unit as for the method of forming the resist film, and further dried to form the topcoat.

A film thickness of the topcoat is preferably 10 to 200 nm, more preferably 20 to 100 nm, and still more preferably 40 to 80 nm.

The topcoat is not particularly limited, a topcoat known in the related art can be formed by the methods known in the related art, and the topcoat can be formed, based on the description in paragraphs 0072 to 0082 of JP2014-059543A, for example.

For example, it is preferable that a topcoat including a basic compound, as described in JP2013-61648A, is formed on the resist film. Specific examples of the basic compound which can be included in the topcoat also include a basic compound which may be included in the above-described composition for forming an underlayer film.

In addition, the topcoat preferably includes a compound which includes at least one group or bond selected from the group consisting of an ether bond, a thioether bond, a hydroxyl group, a thiol group, a carbonyl bond, and an ester bond.

For the purpose of reducing a peeling and collapse of the resist pattern, an adhesion auxiliary layer may be provided between the underlayer film and the resist film. In the step (Q) in this case, the resist film is formed on the adhesion auxiliary layer. In other words, in the step (Q) in this case, the resist film is formed on the underlayer film through the adhesion auxiliary layer.

Examples of a method for forming the adhesion auxiliary layer include a method for forming an adhesion auxiliary layer having a polymerizable group on the underlayer film. The polymerizable group in the adhesion auxiliary layer formed by this method forms a chemical or physical bond with the underlayer film and/or the resist film and the like. As a result, it is considered that excellent adhesiveness is exhibited between the underlayer film and the resist film.

The adhesion auxiliary layer preferably has a polymerizable group. More specifically, it is preferable that a material forming the adhesion auxiliary layer (particularly, a resin is preferable) has a polymerizable group.

The type of the polymerizable group is not particularly limited, and examples thereof include a (meth)acryloyl group, an epoxy group, an oxetanyl group, a maleimide group, an itaconic acid ester group, a crotonic acid ester group, an isocrotonic acid ester group, a maleic acid ester group, a styryl group, a vinyl group, an acrylamide group, and a methacrylamide group. Among these, a (meth)acryloyl group, an epoxy group, an oxetanyl group, or a maleimide group is preferable, and a (meth)acryloyl group is more preferable.

A thickness of the adhesion auxiliary layer is not particularly limited, but from the reason that a more accurate fine pattern can be formed, is preferably 1 to 100 nm, more preferably 1 to 50 nm, still more preferably 1 to 10 nm, and particularly preferably 1 to 5 nm.

The method for forming the above-described adhesion auxiliary layer is not particularly limited, and examples thereof include a method (coating method) in which a composition for forming an adhesion auxiliary layer is applied to the underlayer film, and as necessary, a curing treatment is performed to form the above-described adhesion auxiliary layer, and a method in which the adhesion auxiliary layer is formed on a temporary support, and the adhesion auxiliary layer is transferred to the substrate to the underlayer film. Among these, from the viewpoint of excellent productivity, the coating method is preferable.

A method for applying the composition for forming an adhesion auxiliary layer to the underlayer film is not particularly limited, and a known method can be used. Examples thereof include a spin coating method.

After the composition for forming an adhesion auxiliary layer is applied to the underlayer film, as needed, a curing treatment may be performed. The curing treatment is not particularly limited, and examples thereof include an exposure treatment and a heating treatment.

In the exposure treatment, a ultraviolet (UV) lamp, light irradiation with visible light, or the like is used. Examples of a light source include a mercury lamp, a metal halide lamp, a xenon lamp, a chemical lamp, and a carbon arc lamp. Examples of radiation include electron beams, X-rays, ion beams, and far infrared rays. Examples of a specific aspect include scanning exposure with infrared laser, high-illuminance flash exposure with xenon discharge lamp and the like, and infrared lamp exposure.

An exposure time varies depending on reactivity of the polymer and a light source, but is usually 10 seconds to 5 hours. An exposure energy is preferably 10 to 10000 mJ/cm$^2$ and more preferably 100 to 8000 mJ/cm$^2$.

In addition, in a case of using a heating treatment, a blast dryer, an oven, an infrared dryer, and/or a heating drum can be used.

The exposure treatment and the heating treatment may be combined.

(Resist Composition)

The resist composition may be a positive resist composition or a negative resist composition.

In addition, the resist composition is typically a chemically amplified resist composition.

Hereinafter, each component of the resist composition which can be suitably used in the pattern forming method according to the embodiment of the present invention will be described.

Resin (A)

The resist composition usually includes a resin (also simply referred to as a resin (A)).

The resin (A) preferably has a repeating unit having an acid-decomposable group.

Here, the acid-decomposable group refers to a group which is decomposed by the action of an acid and generates a polar group.

The acid-decomposable group preferably has a structure in which a polar group is protected with a group (leaving group) that is eliminated through decomposition by the action of an acid.

Examples of the polar group include an acidic group (a group which dissociates in a 2.38%-by-mass tetramethylammonium hydroxide aqueous solution), such as a phenolic hydroxyl group, a carboxyl group, a fluorinated alcohol group (preferably, a hexafluoroisopropanol group), a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

The alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol group (for example, a fluorinated alcohol group (hexafluoroisopropanol group and the like)) having the α-position substituted with an electron withdrawing group such as a fluorine atom is excluded as a hydroxyl group. The alcoholic hydroxyl group is preferably a hydroxyl group having a pKa (acid dissociation constant) of 12 to 20.

Preferred examples of the polar group include a carboxyl group, a fluorinated alcohol group (preferably, a hexafluoroisopropanol group), and a sulfonic acid group.

The preferred group as the acid-decomposable group is a group in which the hydrogen atom of these groups is substituted with a group eliminated by acid.

Examples of the group (leaving group) eliminated by acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal group, a tertiary alkyl ester group, or the like is preferable, and a tertiary alkyl ester group is more preferable.

The resin (A) preferably has a repeating unit represented by General Formula (AI) as the repeating unit having an acid-decomposable group. The repeating unit represented by General Formula (AI) generates a carboxyl group as the polar group by the action of an acid.

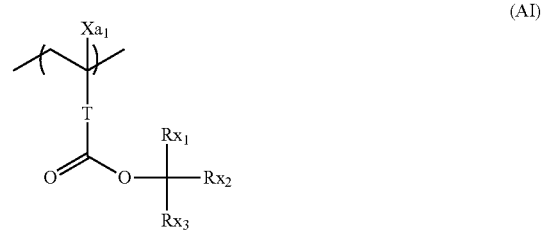

(AI)

In General Formula (AI),

Xa$_1$ represents a hydrogen atom, an alkyl group, a cyano group, or a halogen atom.

T represents a single bond or a divalent linking group.

Rx$_1$ to Rx$_3$ each independently represent an alkyl group or a cycloalkyl group.

Two of Rx$_1$ to Rx$_3$ may be bonded to each other to form a ring structure.

In addition, as the repeating unit having an acid-decomposable group, the resin (A) also preferably has a repeating unit having a structure protected by the leaving group, in which the phenolic hydroxyl group is decomposed and eliminated by the action of an acid. In the present specification, the phenolic hydroxyl group is a group obtained by substituting a hydrogen atom of an aromatic hydrocarbon group with a hydroxyl group. The aromatic ring of the aromatic hydrocarbon group is a monocyclic or polycyclic aromatic ring, and examples thereof include a benzene ring and a naphthalene ring.

As the repeating unit having the structure protected by the leaving group, in which the phenolic hydroxyl group is decomposed and eliminated by the action of an acid, a repeating unit represented by General Formula (AII) is preferable.

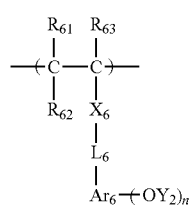

(AII)

In General Formula (AII),

R$_{61}$, R$_{62}$, and R$_{63}$ each independently represent a hydrogen atom, an alkyl group, a cycloalkyl group, a halogen atom, a cyano group, or an alkoxycarbonyl group. However, R$_{62}$ may be bonded to Ar$_6$ to form a ring, and in this case, R$_{62}$ represents a single bond or an alkylene group.

X$_6$ represents a single bond, —COO—, or —CONR$_{64}$—. R$_{64}$ represents a hydrogen atom or an alkyl group.

L$_6$ represents a single bond or an alkylene group.

Ar$_6$ represents an (n+1)-valent aromatic hydrocarbon group, and in a case of being bonded to R$_{62}$ to form a ring, Ar$_6$ represents an (n+2)-valent aromatic hydrocarbon group.

In a case where n≥2, Y$_2$'s each independently represent a hydrogen atom or a group eliminated due to the action of an acid. However, at least one of Y$_2$'s represents the group eliminated due to the action of an acid. As the group eliminated due to the action of an acid as Y$_2$, the group described as the leaving group is preferable.

n represents an integer of 1 to 4.

Each of the above-described groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and these groups preferably have 8 or less carbon atoms.

The repeating unit having an acid-decomposable group may be used alone or in combination of two or more kinds thereof.

A content of the repeating unit having an acid-decomposable group included in the resin (A) (in a case where a plurality of the repeating units having an acid-decomposable group are present, a total content thereof) is preferably 20 to 90 mol % and more preferably 40 to 80 mol % with respect to all the repeating units of the resin (A). Among these, it is preferable that the resin (A) has the above-described repeating unit represented by General Formula (AI), and it is more preferable that the content of the above-described repeating unit represented by General Formula (AI) is 40 mol % or more with respect to all repeating units of the resin (A).

The resin (A) preferably has at least one selected from the group consisting of a lactone structure, a sultone structure, and a carbonate structure, and more preferably has a repeating unit having at least one selected from the group consisting of a lactone structure, a sultone structure, and a carbonate structure.

Any lactone structure or sultone structure can be used as long as the structure has a lactone structure or a sultone structure, but a 5- to 7-membered ring lactone structure or a 5- to 7-membered ring sultone structure is preferable, and a structure in which another ring structure is fused to a 5- to 7-membered ring lactone structure so as to form a bicyclo structure and/or a spiro structure, or a structure in which another ring structure is fused to a 5- to 7-membered ring sultone structure so as to form a bicyclo structure and/or a spiro structure is more preferable. It is even more preferable that the resin (A) has a repeating unit having a lactone structure represented by any of the following General Formula (LC1-1) to (LC1-21) or a sultone structure represented by any of the following General Formula (SL1-1) to (SL1-3). In addition, the lactone structure or the sultone structure may be bonded directly to the main chain.

Among these, as the lactone structure, a lactone structure represented by General Formula (LC1-1), (LC1-4), (LC1-5), (LC1-6), (LC1-13), (LC1-14), or (LC1-17) is preferable, and a lactone structure represented by General Formula (LC1-4) is more preferable. By using such a specific lactone structure, LER and development defects are improved.

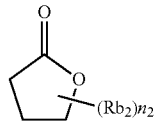

LC1-1

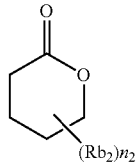

LC1-2

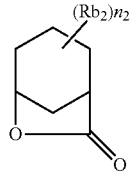

LC1-3

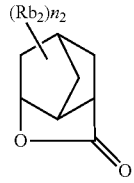

LC1-4

LC1-5 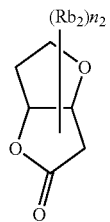
LC1-6 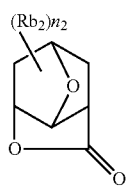
LC1-7 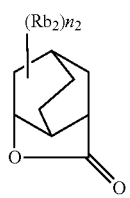
LC1-8 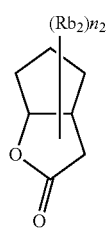
LC1-9 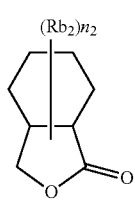
LC1-10 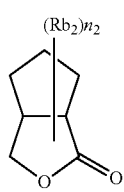
LC1-11 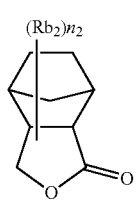
LC1-12 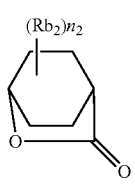
LC1-13 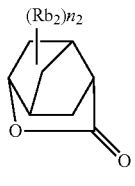
LC1-14 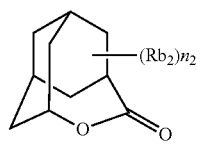
LC1-15 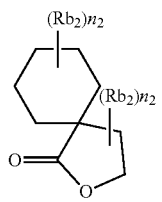
LC1-16 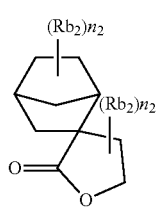
LC1-17 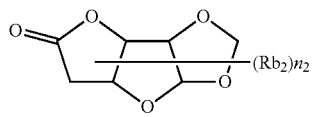
LC1-18 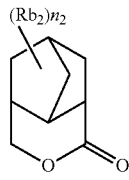
LC1-19 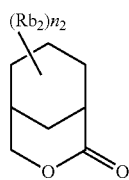
LC1-20 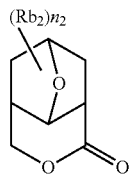

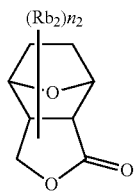

LC1-21

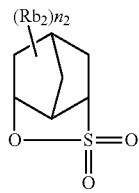

SL1-1

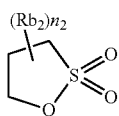

SL1-2

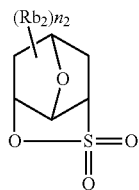

SL1-3

A lactone structural portion or a sultone structural portion may or may not have a substituent ($Rb_2$). Examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group, and an alkyl group having 1 to 4 carbon atoms, a cyano group, or an acid-decomposable group is preferable. $n_2$ represents an integer of 0 to 4. In a case where $n_2$ is 2 or more, a plurality of the substituents ($Rb_2$) may be the same as or different from each other. In addition, the plurality of the substituents ($Rb_2$) may be bonded to each other to form a ring.

In a case where the resin (A) contains a repeating unit having a lactone structure or a sultone structure, the content of the repeating unit having a lactone structure or a sultone structure is preferably 5 to 60 mol %, more preferably 5 to 55 mol %, and still more preferably 10 to 50 mol % with respect to all repeating units of the resin (A).

As the repeating unit having a carbonate structure (cyclic carbonate ester structure), a repeating unit represented by General Formula (A-1) is preferable.

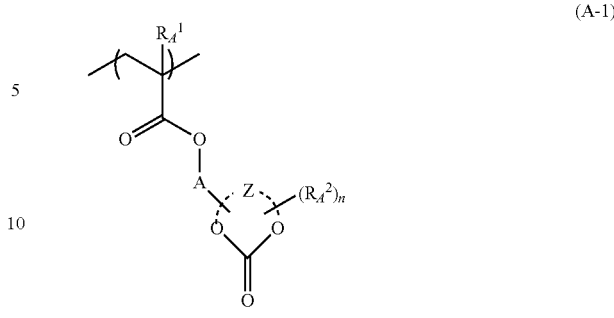

In General Formula (A-1), $R_A^1$ represents a hydrogen atom or an alkyl group.

In a case where n is 2 or more, $R_A^2$'s each independently represent a substituent.

A represents a single bond or a divalent linking group.

Z represents an atomic group which forms a monocyclic or polycyclic structure together with a group represented by —O—C(=O)—O— in the formula. n represents an integer of 0 or more.

In the resin (A), the content of the repeating unit having a cyclic carbonate ester structure (preferably, the repeating unit represented by General Formula (A-1)) is preferably 3 to 80 mol %, more preferably 3 to 60 mol %, still more preferably 3 to 45 mol %, particularly preferably 3 to 30 mol %, and most preferably 10 to 15 mol % with respect to all repeating units constituting the resin (A). By setting such a content, it is possible to improve developability, low defect property, low line width roughness (LWR), low post exposure bake (PEB) temperature dependence, profile, and the like as the resist.

The resin (A) may have a repeating unit having a phenolic hydroxyl group.

Examples of the repeating unit having a phenolic hydroxyl group include a hydroxystyrene repeating unit and a hydroxystyrene (meth)acrylate repeating unit. Among these, the repeating unit having a phenolic hydroxyl group is preferably a repeating unit represented by General Formula (I).

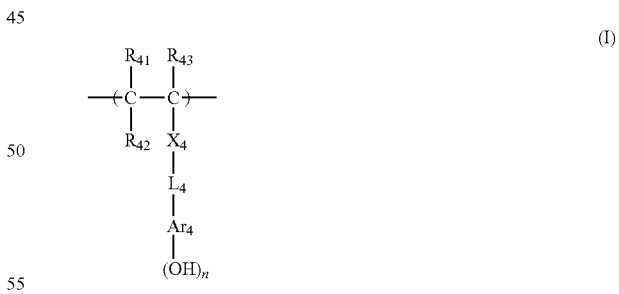

In the formula, $R_{41}$, $R_{42}$, and $R_{43}$ each independently represent a hydrogen atom, an alkyl group, a cycloalkyl group, a halogen atom, a cyano group, or an alkoxycarbonyl group. However, $R_{42}$ may be bonded to $Ar_4$ to form a ring, and in this case, $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or a divalent linking group.

$Ar_4$ represents an (n+1)-valent aromatic hydrocarbon group, and in a case of being bonded to $R_{42}$ to form a ring, Ar₄ represents an (n+2)-valent aromatic hydrocarbon group. n represents an integer of 1 to 5.

For the purpose of increasing polarity of the repeating unit represented by General Formula (I), it is also preferable that n is an integer of 2 or more, or $X_4$ is —COO— or —CONR$_{64}$—.

In the resin (A), with respect to all repeating units of the resin (A), the content of the repeating unit having a phenolic hydroxyl group is preferably 40 mol % or more, more preferably 50 mol % or more, and still more preferably 60 mol % or more, and is preferably 85 mol % or less and more preferably 80 mol % or less.

The resin (A) preferably has a repeating unit having a hydroxyl group or a cyano group, other than the above-described repeating units. As a result, adhesiveness to the substrate and affinity for a developer are improved. The repeating unit having a hydroxyl group or a cyano group is preferably a repeating unit having an alicyclic hydrocarbon structure substituted with a hydroxyl group or a cyano group, and it is preferable to not have an acid-decomposable group. In the alicyclic hydrocarbon structure substituted with a hydroxyl group or a cyano group, the alicyclic hydrocarbon structure is preferably an adamantyl group, a diadamantyl group, or a norbornane group.

The content of the repeating unit having a hydroxyl group or a cyano group is preferably 5 to 40 mol %, more preferably 5 to 30 mol %, and still more preferably 10 to 25 mol % with respect to all the repeating units of the resin (A).

The resin (A) may have a repeating unit having an alkali-soluble group. Examples of the alkali-soluble group include a carboxyl group, a sulfonamide group, a sulfonylimide group, a bissulfonylimide group, and an aliphatic alcohol group (for example, a hexafluoroisopropanol group) in which the α-position is substituted with an electron withdrawing group, and it is preferable to have a repeating unit having a carboxyl group. In a case of containing the repeating unit having an alkali-soluble group, resolution for contact holes is increased. As the repeating unit having an alkali-soluble group, a repeating unit in which an alkali-soluble group is directly bonded to the main chain of a resin, such as a repeating unit with acrylic acid and methacrylic acid, or a repeating unit in which an alkali-soluble group is bonded to the main chain of the resin through a linking group is preferable. Further, it is also preferable to use any of a polymerization initiator or chain transfer agent having an alkali-soluble group to introduce the alkali-soluble group to an end of a polymer chain in a case of polymerization, and the linking group may have a monocyclic or polycyclic cyclic hydrocarbon structure. It is also preferable to use a repeating unit derived from (meth)acrylic acid.

The content of the repeating unit having an alkali-soluble group is preferably 0 to 20 mol %, more preferably 3 to 15 mol %, and still more preferably 5 to 10 mol % with respect to all repeating units of the resin (A).

The resin (A) of the present invention can further have a repeating unit which has an alicyclic hydrocarbon structure without a polar group (for example, the above-described alkali-soluble group, hydroxyl group, cyano group, and the like) and does not exhibit acid decomposition property. Examples of such the repeating unit include a repeating unit represented by General Formula (IV).

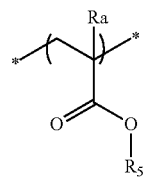

(IV)

In General Formula (IV), $R_5$ represents a hydrocarbon group having at least one cyclic structure and having no polar group.

Ra represents a hydrogen atom, an alkyl group, or a —CH$_2$—O—Ra$_2$ group. In the formula, Ra$_2$ represents a hydrogen atom, an alkyl group, or an acyl group. Ra$_2$ is preferably a hydrogen atom, a methyl group, a hydroxymethyl group, or a trifluoromethyl group, and more preferably a hydrogen atom or a methyl group.

The cyclic structure included in $R_5$ includes a monocyclic hydrocarbon group and a polycyclic hydrocarbon group. Examples of the monocyclic hydrocarbon group include cycloalkyl groups having 3 to 12 carbon atoms, such as a cyclopentyl group, a cyclohexyl group, a cycloheptyl group, and a cyclooctyl group; and cycloalkenyl groups having 3 to 12 carbon atoms, such as a cyclohexenyl group. As the monocyclic hydrocarbon group, a monocyclic hydrocarbon group having 3 to 7 carbon atoms is preferable, and a cyclopentyl group or a cyclohexyl group is more preferable.

The resin (A) may or may not include the repeating unit which has an alicyclic hydrocarbon structure without a polar group and does not exhibit acid decomposition property. In a case where the resin (A) includes these repeating units, the content of the repeating units is preferably 1 to 40 mol % and more preferably 2 to 20 mol % with respect to all repeating units of the resin (A).

In a case where the resist composition is for ArF exposure, it is also preferable that the resin (A) does not substantially have an aromatic group from the viewpoint of transparency to ArF light. More specifically, the repeating unit having an aromatic group is preferably 5 mol % or less, more preferably 3 mol % or less, and still more preferably 0 mol % in all repeating units of the resin (A), that is, it is still more preferable that the repeating unit having an aromatic group is not included. In addition, the resin (A) preferably has a monocyclic or polycyclic alicyclic hydrocarbon structure.

It is also preferable that the resin (A) is a resin in which all repeating units are composed of (meth)acrylate-based repeating units. In this case, any resin of a resin in which all repeating units are methacrylate-based repeating units, a resin in which all repeating units are acrylate-based repeating units, or a resin with all repeating units consisting of a methacrylate-based repeating unit and an acrylate-based repeating unit can be used. Among these, a resin in which the acrylate-based repeating unit is 50 mol % or less of all repeating units is preferable.

The resin (A) can be synthesized in accordance with an ordinary method (for example, radical polymerization).

A weight-average molecular weight of the resin (A) is preferably 1,000 to 200,000, more preferably 2,000 to 40,000, still more preferably 3,000 to 30,000, and particularly preferably 4,000 to 25,000. By setting the weight-average molecular weight to 1,000 to 200,000, it is possible to prevent deterioration of heat resistance or dry etching resistance, and it is also possible to prevent deterioration of developability or deterioration in film-forming properties caused by an increase in a viscosity.

A dispersity (molecular weight distribution) of the resin (A) is usually 1.0 to 3.0, and preferably 1.0 to 2.6, more preferably 1.0 to 2.0, and still more preferably 1.1 to 2.0. As the molecular weight distribution is smaller, resolution and a resist shape are excellent, a side wall of the resist pattern is smoother, and roughness is excellent.

In the present specification, a weight-average molecular weight (Mw) and a dispersity of the resin included in the resist composition are values expressed in terms of standard polystyrene, which are obtained by gel permeation chromatography (GPC) under the following conditions.

Column type: TSK gel Multipore HXL-M (manufactured by Tosoh Corporation, 7.8 mmID×30.0 cm)
Developing solvent: tetrahydrofuran (THF)
Column temperature: 40° C.
Flow rate: 1 ml/min
Sample injection amount: 10 μl
Device name: HLC-8120 (manufactured by Tosoh Corporation)

A content of the resin (A) is preferably 20% by mass or more, more preferably 40% by mass or more, still more preferably 60% by mass or more, and particularly preferably 80% by mass or more with respect to the total solid content of the resist composition. The content of the resin (A) is preferably 99% by mass or less with respect to the total solid content of the resist composition.

The resin (A) may be used alone or may be used in combination of two or more kinds thereof.

Photoacid Generator

The resist composition preferably includes a photoacid generator (compound which generates an acid by irradiation with actinic ray or radiation).

The photoacid generator is not particularly limited, but a compound which generates an organic acid by irradiation with actinic ray or radiation is preferable.

As the photoacid generator, a photoinitiator for photocationic polymerization, a photoinitiator for photoradical polymerization, a light-decoloring agent of coloring agents, a photochromic agent, or a known compound which generates an acid by irradiation with actinic ray or radiation and a mixture thereof, which are used for microresist or the like, can be appropriately selected and used, and examples thereof include compounds described in paragraphs 0039 to 0103 of JP2010-61043A and compounds described in paragraphs 0284 to 0389 of JP2013-4820A. However, the present invention is not limited thereto.

Examples thereof include a diazonium salt, a phosphonium salt, a sulfonium salt, an iodonium salt, imide sulfonate, oxime sulfonate, diazodisulfone, disulfone, and o-nitrobenzylsulfonate.

As the photoacid generator contained in the resist composition, for example, a compound (specific photoacid generator) generating an acid by irradiation with actinic ray or radiation, which is represented by General Formula (3), is preferable.

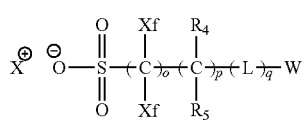

(3)

(Anion)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where a plurality of $R_4$'s and $R_5$'s are present, the plurality thereof may be the same or different from each other.

L represents a divalent linking group, and in a case where a plurality of L's are present, the plurality thereof may be the same or different from each other.

W represents an organic group including a cyclic structure.

o represents an integer of 1 to 3. p represents an integer of 0 to 10. q represents an integer of 0 to 10.

(Cation)

In General Formula (3), $X^+$ represents a cation.

$X^+$ is not particularly limited as long as it is a cation, but examples of a suitable aspect thereof include cations (portion other than $Z^-$) in General Formulae (ZI), (ZII), and (ZIII) shown below.

(Suitable Aspect)

Examples of the suitable aspects of the specific photoacid generator include a compound represented by General Formula (ZI), (ZII), or (ZIII).

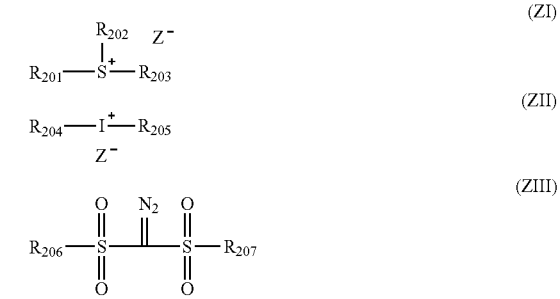

In General Formula (ZI), $R_{201}$, $R_{202}$, and $R_{203}$ each independently represent an organic group.

The organic group as $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, and/or a carbonyl group. Examples of the group formed by the bonding of two of $R_{201}$ to $R_{203}$ include an alkylene group (for example, a butylene group and a pentylene group).

$Z^-$ represents an anion in General Formula (3), and is specifically as described above.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The photoacid generator (including the specific photoacid generator; the same applies hereinafter) may be in a form of a low-molecular-weight compound, or may be in a form incorporated in a part of a polymer. In addition, a combination of the form of a low-molecular-weight compound and the form incorporated in a part of a polymer may also be used.

In a case where the photoacid generator is in the form of a low-molecular-weight compound, the molecular weight is preferably 580 or more, more preferably 600 or more, still more preferably 620 or more, and particularly preferably 640 or more. An upper limit thereof is not particularly limited, but is preferably 3000 or less, more preferably 2000 or less, and still more preferably 1000 or less.

In a case where the photoacid generator is incorporated in a part of a polymer, the photoacid generator may be incorporated in a part of the above-mentioned resin or in a resin other than the resin.

The photoacid generator can be synthesized by a known method, and can be, for example, synthesized according to a method described in JP2007-161707A.

The photoacid generator may be used singly or in combination of two or more kinds thereof. A content of the photoacid generator (in a case where a plurality of the photoacid generators are present, a total content thereof) in the composition is preferably 0.1% to 30/o by mass, more preferably 0.5% to 25% by mass, still more preferably 3% to 20% by mass, and particularly preferably 3% to 15% by mass based on the total solid content of the composition.

In a case where the compound represented by General Formula (ZI-3) or (ZI-4) is included as the photoacid generator, the content of the photoacid generator (in a case where a plurality of the photoacid generators are present, a total content thereof) included in the composition is preferably 1.5% to 35% by mass, more preferably 5% to 35% by mass, still more preferably 9/o to 30% by mass, and particularly preferably 9% to 25% by mass based on the total solid content of the composition.

Acid Diffusion Control Agent

The resist composition preferably contains an acid diffusion control agent. The acid diffusion control agent acts as a quencher which suppresses a reaction of an acid-decomposable resin in a non-exposed portion by excessive generated acids by trapping the acids generated from the photoacid generator and the like during exposure. As the acid diffusion control agent, a basic compound, a low-molecular-weight compound having a nitrogen atom and having a group eliminated due to the action of acid, a basic compound in which basicity decreases or disappears by irradiation with actinic rays or radiation, or an onium salt which is relatively a weak acid to the photoacid generator can be used.

Examples of the basic compound include the basic compounds which can be used in the composition for forming an underlayer film.

The resist composition may or may not contain the basic compound, but in a case of containing the basic compound, a content of the basic compound is preferably 0.001% to 10% by mass and more preferably 0.01% to 5% by mass with respect to the total solid content of the resist composition. A proportion of the photoacid generator and the basic compound used in the composition is preferably photoacid generator/basic compound (molar ratio)=2.5 to 300, more preferably 5.0 to 200, and still more preferably 7.0 to 150.

Hydrophobic Resin

The resist composition may include a hydrophobic resin other than the resin (A), in addition to the resin (A).

It is preferable that the hydrophobic resin is designed to be unevenly distributed on a surface of the resist film, but unlike a surfactant, the hydrophobic resin does not necessarily have a hydrophilic group in a molecule thereof and may not necessarily contribute to homogeneous mixing of polar substances and non-polar substances.

Examples of the effect of addition of the hydrophobic resin include a control of static and dynamic contact angles of a surface of the resist film with respect to water and suppression of out gas.

From the viewpoint of uneven distribution on the film surface layer, the hydrophobic resin preferably has any one or more of a "fluorine atom", a "silicon atom", or a "$CH_3$ partial structure which is included in a side chain moiety of a resin", and more preferably has two or more kinds thereof. In addition, the above-described hydrophobic resin preferably has a hydrocarbon group having 5 or more carbon atoms. These groups may be included in the main chain of the resin or may be substituted in the side chain.

In a case where hydrophobic resin includes a fluorine atom and/or a silicon atom, the fluorine atom and/or the silicon atom in the hydrophobic resin may be included in the main chain or the side chain of the resin.

In a case where the resist composition includes a hydrophobic resin, a content of the hydrophobic resin is preferably 0.01% to 20% by mass, and more preferably 0.1% to 15% by mass with respect to the total solid content of the resist composition.

Solvent

It is preferable that the resist composition includes a solvent.

Examples of the solvent which can be used in preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Specific examples of these solvents include solvents described in paragraphs 0441 to 0455 of US2008/0187860A.

Surfactant

The resist composition may or may not further contain a surfactant.

The surfactant is preferably a fluorine-based and/or silicon-based surfactant (a fluorine-based surfactant, a silicon-based surfactant, or a surfactant having both a fluorine atom and a silicon atom).

The surfactants may be used singly or in combination of two or more kinds thereof.

In a case where the resist composition contains a surfactant, an amount of the surfactant used is preferably 0.0001% to 2% by mass, and more preferably 0.0005% to 1% by mass with respect to the total solid content of the resist composition.

Other Additives

The resist composition may or may not contain a carboxylic acid onium salt. Examples of such a carboxylic acid onium salt include those described in paragraphs 0605 and 0606 of US2008/0187860A.

These carboxylic acid onium salts can be synthesized by reacting a sulfonium hydroxide, an iodonium hydroxide, or an ammonium hydroxide with a carboxylic acid in a suitable solvent with silver oxide.

In a case where the resist composition contains a carboxylic acid onium salt, a content thereof is preferably 0.1% to 20% by mass, more preferably 0.5% to 10% by mass, and still more preferably 1% to 7% by mass with respect to the total solid content of the composition.

As necessary, the resist composition can further contain an acid proliferation agent, a dye, a plasticizer, a photosensitizer, a light absorbing agent, an alkali-soluble resin, a dissolution inhibitor, a compound which promotes solubility in a developer (for example, a phenol compound having a molecular weight of 1000 or less, and an alicyclic or aliphatic compound having a carboxyl group), or the like.

Such a phenol compound having a molecular weight of 1000 or less can be synthesized by those skilled in the art with reference to methods described in, for example, JP1992-122938A (JP-H4-122938A), JP1990-28531A (JP-H2-28531A), U.S. Pat. No. 4,916,210A, EP219294B, and the like.

Examples of the alicyclic or aliphatic compound having a carboxyl group include carboxylic acid derivatives having a steroid structure such as cholic acid, deoxycholic acid, and lithocholic acid, adamantanecarboxylic acid derivatives, adamantanedicarboxylic acid, cyclohexanecarboxylic acid, and cyclohexanedicarboxylic acid, but the present invention is not limited thereto.

A concentration of solid contents in the resist composition is preferably 1.0% to 20% by mass, more preferably 2.0% to 15% by mass, and still more preferably 2.0% to 10% by mass.

By setting the concentration of solid contents within the above-described range, a resist solution can be uniformly applied to the substrate, and further, it is possible to form a resist pattern having excellent line width roughness. The reason is not clear, but probably, it is considered that, by setting the concentration of solid contents to 20% by mass or less, aggregation of materials, particularly the photoacid generator, in the resist solution is suppressed, and as a result, a uniform resist film can be formed.

The concentration of solid contents in the resist composition is a weight percentage of weights of other resist components excluding the solvent with respect to the total weight of the composition.

A method for preparing the resist composition is not particularly limited, but it is preferable to dissolve each of the above-described components in a predetermined organic solvent, preferably in the above-described mixed solvent, and filter the composition. A filter used for the filtration using a filter is preferably made of polytetrafluoroethylene, polyethylene, or nylon, which has a pore size of 0.1 µm or less (preferably 0.05 µm or less and more preferably 0.03 µm or less). In the filtration using a filter, for example, circulating filtration may be performed or the filtration may be performed by connecting plural kinds of filters in series or in parallel, as described in JP2002-62667A. In addition, the composition may be filtered in plural times. Furthermore, the composition may be subjected to a deaeration treatment or the like before or after the filtration using a filter.

<Step R (Exposing Step)>

In the exposing step, the above-described resist film is exposed.

Light used in the exposure is not particularly limited, and examples thereof include infrared rays, visible light, ultraviolet rays, far ultraviolet rays, extreme ultraviolet rays, X-rays, and electron beams. A wavelength of the light is preferably 250 nm or less, more preferably 220 nm or less, and still more preferably 1 to 200 nm.

More specific examples thereof include a KrF excimer laser (248 nm), an ArF excimer laser (193 nm), an $F_2$ excimer laser (157 nm), X-rays, EUV (13 nm), and electron beams, and among these, a KrF excimer laser, an ArF excimer laser, EUV, or electron beams are preferable.

The exposure in the exposing step may be a liquid immersion exposure.

The liquid immersion exposure can be combined with super-resolution techniques such as a phase shift method and a modified illumination method. The liquid immersion exposure can be performed according to, for example, a method described in paragraphs 0594 to 0601 of JP2013-242397A.

After the step R (exposing step) and before the step S (developing step), the exposed resist film may be subjected to a heating treatment (Post Exposure Bake: PEB). This step promotes the reaction of the exposed portion. The heating treatment (PEB) may be performed in plural times.

A temperature in the heating treatment is preferably 70° C. to 130° C. and more preferably 80° C. to 120° C.

A time of the heating treatment is preferably 30 to 300 seconds, more preferably 30 to 180 seconds, and still more preferably 30 to 90 seconds.

The heating treatment can be performed using a unit included in an ordinary exposure machine and/or development machine, or may also be performed using a hot plate or the like.

<Step S (Developing Step)>

In the developing step, the exposed resist film is developed with a developer to form a resist pattern.

Examples of a preferred embodiment of the resist pattern include a resist pattern which has a line portion having a line width of 5000 nm or less. In the embodiment, the line width of the line portion is more preferably 1000 nm or less and still more preferably 500 nm or less. In addition, the line width of the line portion is usually 10 nm or more.

The developer in the developing step may be an alkali developer or a developer (organic developer) including an organic solvent.

As the alkali developer, a quaternary ammonium salt typified by tetramethylammonium hydroxide is usually used. In addition, an alkali aqueous solution including an inorganic alkali, primary to tertiary amines, alcohol amines, cyclic amines, and the like can also be used.

Specific examples of the alkali developer include alkaline aqueous solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; cyclic amines such as pyrrole and piperidine; and the like. Among these, it is preferable to use an aqueous solution of tetraethylammonium hydroxide.

Furthermore, alcohols or surfactants may be added to the above-described alkali developer in an appropriate amount. An alkali concentration of the alkali developer is usually 0.1% to 20% by mass. A pH of the alkali developer is usually 10.0 to 15.0.

A time for performing the development using the alkali developer is usually 10 to 300 seconds.

The alkali concentration (and pH), and the development time of the alkali developer can be appropriately adjusted depending on a pattern formed.

After the development using the alkali developer, it may be washed with a rinsing liquid, and as the rinsing liquid, pure water may be used, and an appropriate amount of a surfactant may be added and used.

In addition, after the developing treatment or the rinsing treatment, a treatment of removing the developer or the rinsing liquid adhering to the pattern with a supercritical fluid can be performed.

Furthermore, after the rinsing treatment or the treatment using a supercritical fluid, a heating treatment for removing moisture remaining in the pattern can be performed.

As the organic developer include polar solvents such as a ketone-based solvent, an ester-based solvent, an alcohol-based solvent, an amide-based solvent, and an ether-based solvent, and hydrocarbon-based solvents can be used, and specific examples thereof include solvents described in paragraphs 0461 to 0463 of JP2014-048500A, methyl 2-hydroxyisobutyrate, butyl butyrate, isobutyl isobutyrate, butyl propionate, butyl butanoate, and isoamyl acetate.

A plurality of the above-described solvents may be mixed, or the solvent may also be used in admixture with a solvent other than those described above or water. However, a moisture content of the organic developer as a whole is preferably less than 10% by mass, and the organic developer is more preferably substantially free of the moisture.

That is, the content of the organic solvent to the organic developer is preferably 90% to 100% by mass and more preferably 95% to 100% by mass with respect to the total amount of the developer.

The organic developer is preferably a developer containing at least one organic solvent selected from the group consisting of a ketone-based solvent, an ester-based solvent, an alcohol-based solvent, an amide-based solvent, and an ether-based solvent.

A vapor pressure of the organic developer at 20° C. is preferably 5 kPa or less, more preferably 3 kPa or less, and still more preferably 2 kPa or less. By setting the vapor pressure of the organic developer to 5 kPa or less, evaporation of the developer on the substrate or in a development cup is suppressed, temperature uniformity in a wafer plane is improved, and as a result, dimensional uniformity in the wafer plane is improved.

An appropriate amount of a surfactant can be added to the organic developer, as necessary.

The surfactant is not particularly limited, but, for example, an ionic or nonionic fluorine-based and/or silicon-based surfactant, or the like can be used. Examples of the fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), U.S. Pat. Nos. 5,405,720A, 5,360,692A, 5,529,881A, 5,296,330A, 5,436,098A, 5,576,143A, 5,294,511A, and 5,824,451A. The surfactant is preferably nonionic surfactant. The nonionic surfactant is not particularly limited, but it is still more preferable to use a fluorine-based surfactant or a silicon-based surfactant.

An amount of the surfactant used is usually 0.001% to 5% by mass, preferably 0.005% to 2% by mass, and still more preferably 0.01% to 0.5% by mass with respect to the total amount of the developer.

The organic developer may include a basic compound. Specific examples and preferred examples of the basic compound which can be included in the organic developer used in the present invention include the same basic compounds which can be used as the acid diffusion control agent.

As a developing method, for example, a method in which the substrate is dipped in a tank filled with the developer for a certain period of time (a dipping method), a method in which development is performed by heaping the developer up onto a surface of the substrate by surface tension, and then stopping it for a certain period of time (a puddle method), a method in which the developer is sprayed on a surface of the substrate (a spray method), a method in which the developer is continuously jetted onto the substrate rotating at a constant rate while scanning a developer jetting nozzle at a constant rate (a dynamic dispensing method), or the like can be adopted.

A suitable range of a jetting pressure of the developer to be jetted, a method of adjusting the jetting pressure of the developer, and the like are not particularly limited, but for example, a range and method described in paragraphs 0631 to 0636 of JP2013-242397A.

In the pattern forming method according to the embodiment of the present invention, a combination of a step (alkali developing step) of performing development using the alkali developer and a step (organic solvent developing step) of performing development using a developer including an organic solvent may be used.

A portion with a low exposure intensity can be removed by the organic solvent developing step, and a portion with a high exposure intensity can be removed by performing the alkali developing step. By virtue of multiple development processes in which development is performed in plural times in such a manner, a pattern can be formed by keeping only a region with an intermediate exposure intensity from not being dissolved, so that a finer pattern than usual can be formed (the same mechanism as in paragraph 0077 of JP2008-292975A).

In this case, the order of the alkali developing step and the organic solvent developing step is not particularly limited, but it is more preferable that the alkali development is performed before the organic solvent developing step.

After the organic solvent developing step, it is preferable to include a washing step with a rinsing liquid.

The rinsing liquid used in the rinsing step after the organic solvent developing step is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Water may be used as the rinsing liquid used in the rinsing step after the organic solvent developing step.

Specific examples of the hydrocarbon-based solvent, ketone-based solvent, ester-based solvent, alcohol-based solvent, amide-based solvent, and ether-based solvent include the same solvents as those described for the developer including an organic solvent.

After the organic solvent developing step, it is preferable to perform a washing step with a rinsing liquid containing at least one organic solvent selected from the group consisting of a ketone-based solvent, an ester-based solvent, an alcohol-based solvent, an amide-based solvent, and a hydrocarbon-based solvent, it is more preferable to perform a washing step with a rinsing liquid containing an alcohol-based solvent or an ester-based solvent, it is still more preferable to perform a washing step with a rinsing liquid containing a monohydric alcohol, and it is particularly preferable to perform a washing step with a rinsing liquid containing a monohydric alcohol having 5 or more carbon atoms.

As the rinsing liquid containing a hydrocarbon-based solvent, a hydrocarbon compound having 6 to 30 carbon atoms is preferable, a hydrocarbon compound having 8 to 30 carbon atoms is more preferable, and a hydrocarbon compound having 10 to 30 carbon atoms is particularly preferable. Among these, by using a rinsing liquid containing decane and/or undecane, pattern collapse is suppressed.

In a case where the ester-based solvent is used as the organic solvent, a glycol ether-based solvent may be used in addition to the ester-based solvent (one type or two or more types). Specific examples in this case include a case in which an ester-based solvent (preferably, butyl acetate) is used as a main component, and a glycol ether-based solvent (preferably, propylene glycol monomethyl ether (PGME)) is used as a sub-component. As a result, residual defects are further suppressed.

Here, examples of the monohydric alcohol used in the rinsing step include linear, branched, or cyclic monohydric alcohols, and examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol.

A plurality of the respective components may be mixed with, or the components may also be used in admixture with an organic solvent other than the solvents.

A moisture content in the rinsing liquid is preferably 10% by mass or less, more preferably 5% by mass or less, and still more preferably 3% by mass or less. By setting the moisture content to 10% by mass or less, good development characteristics can be obtained.

A vapor pressure of the rinsing liquid used after the step of performing development using a developer including an organic solvent at 20° C. is preferably 0.05 to 5 kPa, more preferably 0.1 to 5 kPa, and still more preferably 0.12 to 3 kPa. By setting the vapor pressure of the rinsing liquid within the above-described range, the temperature uniformity in the wafer plane is enhanced, swelling due to the permeation of the rinsing liquid is suppressed, and the dimensional uniformity in the wafer plane is improved.

An appropriate amount of a surfactant may be added to the rinsing liquid before use.

In the rinsing step, the developed substrate (resist pattern on the substrate) is washed with the above-described rinsing liquid. A method for the washing treatment is not particularly limited, for example, a method in which a rinsing liquid is continuously jetted on a substrate rotating at a constant rate (a spin coating method), a method in which a substrate is dipped in a tank filled with a rinsing liquid for a certain period of time (a dipping method), a method in which a rinsing liquid is sprayed on a substrate surface (a spray method), and/or the like, and among these, a method in which a washing treatment is performed using the rotation application method, and a substrate is rotated at a rotation speed of 2000 to 4000 rpm after washing, thereby removing the rinsing liquid from the substrate, is preferable. Furthermore, it is also preferable that the method includes a heating step (post bake) after the rinsing step. The developer and the rinsing liquid remaining between and inside the patterns are removed by the baking. The heating step after the rinsing step is performed, usually at 40° C. to 160° C. (preferably 70° C. to 95° C.), and usually for 10 seconds to 3 minutes (preferably for 30 seconds to 90 seconds).

It is preferable that the various materials (for example, the developer, the rinsing liquid, and the like) used in the pattern forming method according to the embodiment of the present invention do not include impurities such as metals. Examples of the metal impurity component include Na, K, Ca, Fe, Cu, Mn, Mg, Al, Cr, Ni, Zn, Ag, Sn, Pb, and Li. A total content of the impurities included in these materials is preferably 1 part per million (ppm) by mass or less, more preferably 10 ppb by mass or less, still more preferably 100 parts per trillion (ppt) by mass or less, particularly preferably 10 ppt by mass or less, and most preferably 1 ppt by mass or less.

Examples of a method for removing the impurities such as metals from the above-described various materials include filtration using a filter. As a filter pore diameter, a pore size is preferably 50 nm or less, more preferably 10 nm or less, and still more preferably 5 nm or less. As a material of the filter, a polytetrafluoroethylene-made, polyethylene-made, or nylon-made filter is preferable. In the step of filtration using a filter, a plurality of kinds of filters may be connected and used in series or in parallel. In a case of using the plurality of kinds of filters, a combination of filters having different pore diameters and/or materials may be used. In addition, various materials may be filtered plural times, and the step of filtering plural times may be a circulatory filtration step.

In addition, examples of a method for reducing the impurities such as metals included in the above-described various materials include a method of selecting a raw material having a low metal content as a raw material constituting the various materials, performing filtration using a filter on the raw material constituting the various materials, and the like. Preferred conditions for the filtration using a filter performed on the raw materials constituting the various materials are the same ones as the above-described conditions.

In addition to the filtration using a filter, the impurities may be removed by an adsorbing material, or the filtration and the adsorbing material may be used in combination. As the adsorbing material, a known adsorbing material can be used, and for example, inorganic adsorbing materials such as silica gel and zeolite, and organic adsorbing materials such as activated carbon can be used.

It is necessary to prevent the incorporation of metal impurities in the production process in order to reduce the impurities such as metals included in the various materials. Sufficient removal of the metal impurities from a production device can be confirmed by measuring the content of metal components included in a washing solution used to wash the production device. The content of the metal components included in the washing solution after the use is preferably 100 parts per trillion (ppt) by mass or less, more preferably 10 ppt by mass or less, and still more preferably 1 ppt by mass or less.

A conductive compound may be added to an organic treatment liquid (resist solvent, developer, rinsing liquid, and the like) used in the resist pattern forming method according to the embodiment of the present invention in order to prevent breakdown of chemical liquid pipes and various parts (a filter, an O-ring, a tube, or the like) due to electrostatic charging, and subsequently generated electrostatic discharging. The conductive compound is not particularly limited, but examples thereof include methanol. The addition amount is not particularly limited, but from the viewpoint of maintaining good development characteristics, the addition amount is preferably 10% by mass or less and more preferably 5% by mass or less. With regard to the members of the chemical liquid pipe, it is possible to use various pipes coated with stainless steel (SUS), or a polyethylene resin, a polypropylene resin, or a fluororesin (a polytetrafluoroethylene resin, a perfluoroalkoxy resin, or the like), which has been subjected to an antistatic treatment. Similarly, a polyethylene resin, a polypropylene resin, or a fluororesin (a polytetrafluoroethylene resin, a perfluoroalkoxy resin, or the like), which has been subjected to an antistatic treatment, can be used for a filter and an O-ring.

A method for improving the surface roughness of a pattern may be adopted to the resist pattern formed by the method of the embodiment of the present invention.

Examples of the method for improving the surface roughness of the pattern include the method of treating a resist pattern by a plasma of a hydrogen-containing gas described in WO2014/002808A. In addition, known methods as described in JP2004-235468A, US2010/0020297A, JP2008-83384A, and Proc. of SPIE Vol. 8328 83280N-1 "EUV Resist Curing Technique for LWR Reduction and Etch Selectivity Enhancement" may be adopted.

The resist pattern forming method according to the embodiment of the present invention can also be used for forming a guide pattern in a directed self-assembly (DSA) (see, for example, ACS Nano Vol. 4, No. 8, Pages 4815-4823).

In addition, the resist pattern formed by the method can be used as a core material (core) of the spacer process disclosed in, for example, JP1991-270227A (JP-H3-270227A) and JP2013-164509A.

In addition, a resist pattern miniaturization process may be adopted to the resist pattern formed by the method of the present invention. Examples of the resist pattern miniaturization process include a method of applying a miniaturization composition on the pattern and heating it to increase the width of the resist pattern, as shown in JP2013-145290A and JP2014-071424A. In order to maintain etching resistance of the resist pattern after the miniaturization process, it is preferable that the miniaturization composition contains a silicon atom.

<Other Steps>

Using the resist pattern obtained by the above-described method as a mask, a step of processing (etching such as dry etching) the underlayer film to form an underlayer pattern may be performed. Thereafter, a step of further processing (etching such as dry etching) the substrate to form a pattern on the substrate may be performed.

A method for processing the underlayer film is not particularly limited.

Among these, as the process of the underlayer film, a treatment of forming the underlayer pattern by etching (dry etching or the like) on the underlayer film using the resist pattern as a mask is preferable.

The dry etching may be one-stage etching or multi-stage etching. In a case where the etching is an etching including a plurality of stages, the etchings at the respective stages may be the same treatment or different treatment.

A system of a dry etching device is not particularly limited, but in particular, a system in which a plasma density and a bias voltage are independently controlled, such as an inductive coupled plasma (ICP; inductive coupling) type, a dual frequency conducive coupled plasma (CCP; capacitive coupling) type, and an electron cyclotron resonance (ECR) type, is more preferable.

For the etching, any known methods can be used, and various conditions and the like are appropriately determined according to the type of the substrate, usage, and the like. The etching can be carried out, for example, in accordance with The International Society for Optical Engineering (Proc. of SPIE), Vol. 6924, 692420 (2008), JP2009-267112A, and the like. In addition, the etching can also be carried out in accordance with "Chapter 4 Etching" in "Semiconductor Process Text Book, 4th Ed., published in 2007, publisher: SEMI Japan".

An etching gas used for the dry etching of the underlayer film can be appropriately selected depending on the element composition of the underlayer film to be etched, and the like, and examples thereof include fluorine gas such as $CHF_3$, $CF_4$, $C_2F_6$, $C_3F_8$, and $SF_6$; chlorine gas such as $Cl_2$ and $BCl_3$; oxygen gas such as $O_2$, $O_3$, and $H_2O$; gas such as $H_2$, $NH_3$, CO, and $CO_2$; and inert gas such as He, $N_2$, and Ar. One type or two or more types of these gases can be used.

As the etching gas used for etching the underlayer film, a fluorine gas is preferable, and an etching gas obtained by mixing an oxygen gas and inert gas with the fluorine gas is preferable.

The processing of the substrate is preferably a treatment of forming a pattern by etching (dry etching or the like) on the substrate using the underlayer pattern formed as described above and/or a second underlayer pattern described later as a mask.

As the etching gas used for etching the substrate, an oxygen gas is preferable, and an etching gas obtained by mixing an inert gas with the oxygen gas is more preferable.

In addition, in a case of forming the second underlayer film which is an organic layer, it is preferable to performing etching (dry etching or the like) of the second underlayer film which is an organic layer using the underlayer pattern as a mask, and then performing etching of the substrate. In this case, it is also preferable to use the second underlayer pattern obtained by etching the second underlayer film as a mask for etching the substrate.

As the etching gas used for dry etching of the second underlayer film which is an organic layer, an oxygen gas is preferable, and an etching gas obtained by mixing an inert gas with the oxygen gas is more preferable.

In the semiconductor device manufacturing, in a case where the pattern formation is performed on the substrate as described above, a step of inspecting whether the target pattern dimension is actually formed after the pattern formation may be performed. In a case where the size is out of the allowable range, a method of removing the underlayer film and/or the resist pattern, and then re-forming the pattern from the application of the underlayer film and/or the resist film is generally performed (rework step).

In this case, it is important to completely remove the underlayer film and/or the resist film on the substrate in order to prevent occurrence of defects in the exposing step, the developing step, and the like. In a resist film peeling method, by a dry treatment (ashing) using oxygen gas, it is possible to almost completely peel off the resist film by removing most of the organic compounds on the substrate and then rinsing as necessary, which is widely performed.

In addition to the dry treatment as described above, a wet treatment may be performed in the rework step. Examples of a treatment liquid (stripper) applied in this case include a mixed liquid of sulfuric acid and hydrogen peroxide water, a dilute fluorine aqueous solution, an alkali aqueous solution, and an organic solvent, but the present invention is not limited thereto.

In the above-described wet treatment, it is more preferable to add a surfactant to the treatment liquid in order to effectively perform wet peeling. Examples of the surfactant include a fluorine-based surfactant and a silicon-based surfactant.

Before the wet peeling step, it is also possible to adopt a process such as full exposure and/or heating to the substrate on which the resist film is formed. By accelerating polarity conversion reaction of the resist film, the effect of improving solubility in the wet treatment liquid can be expected.

The present invention also relates to an ion implantation method in which ions are implanted into a substrate using the pattern obtained by the above-described pattern formation as a mask.

As the ion implantation method, any known method can be adopted.

In addition, the present invention also relates to a kit including a composition for forming an underlayer film and a resist composition, which is used in the pattern forming method according to the embodiment of the present invention described above.

[Manufacturing Method of Electronic Device]

In addition, the present invention also relates to a manufacturing method of an electronic device, which includes the resist pattern forming method according to the embodiment of the present invention described above or an ion implantation method.

The electronic device manufactured by the manufacturing method of an electronic device according to the embodiment of the present invention can be suitably mounted on electric or electronic apparatus (home electronics, office automation (OA), media-related equipment, optical equipment, and telecommunication equipment).

EXAMPLES

Hereinbelow, the present invention will be described in more detail with reference to Examples. The materials, the amounts and proportions of the materials used, the details of treatments, the procedure of treatments, and the like shown in the following Examples can be appropriately modified as long as the gist of the present invention is maintained.

Accordingly, the scope of the present invention will not be restrictively interpreted by the following Examples.

[Production of Composition for Forming Underlayer Film]

Components included in compositions for forming an underlayer film, used in Examples or Comparative Examples, and a manufacturing procedure are shown below.

<Polysiloxane (Silicon Atom-Containing Compound)>

An aqueous solution of oxalic acid was prepared by heating and dissolving 10.9 g of oxalic acid in 163.8 g of water.

Next, a 5 L volume flask into which 252.6 g (75 mol %) of ethoxysilane, 33.0 g (15 mol %) of methyltrimethoxysilane, 32.1 g (10 mol %) of phenyltrimethoxysilane, and 507.7 g of propylene glycol monoethyl ether (PGEE) were charged was prepared.

A cooling pipe and a dropping funnel including the above-described aqueous solution of oxalic acid were attached to the above-described flask. Next, in an oil bath, the contents of the above-described were heated to 60° C. Thereafter, the above-described aqueous solution of oxalic acid was slowly added dropwise to the above-described flask, and the mixture was reacted at 60° C. for 4 hours. After completion of the reaction, the above-described flask was allowed to cool, and then the flask was set on an evaporator, and volatile components (unreacted components and/or PGEE or the like) in the flask were distilled off. Thereafter, the solid component remaining in the flask was taken out, and the solid component was washed with water on a filter paper and then dried to obtain a polysiloxane. In addition, as a result of GPC measurement, Mw of the polysiloxane was 3,000.

<Acid Generator>

The following compounds were used as an acid generator (photoacid generator).

In the following structural formulae, "Bu" represents an n-butyl group.

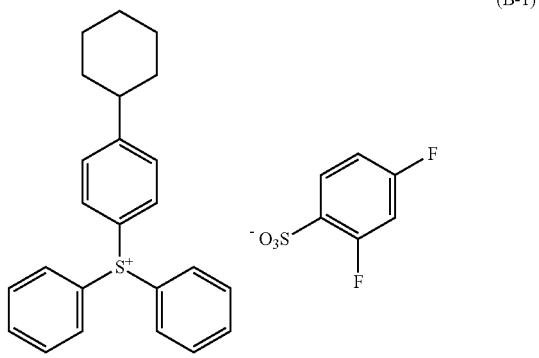

(B-1)

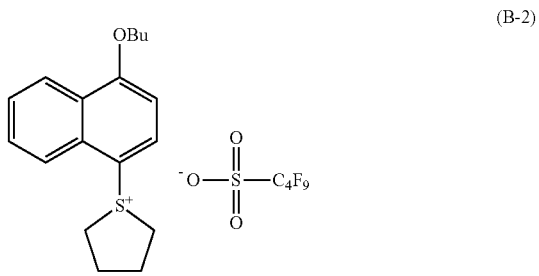

(B-2)

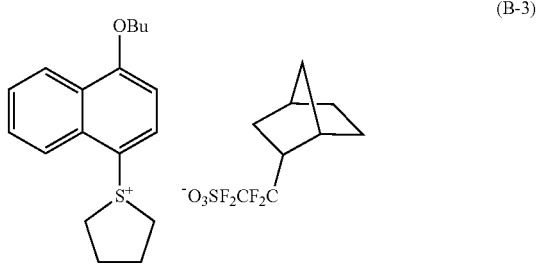

(B-3)

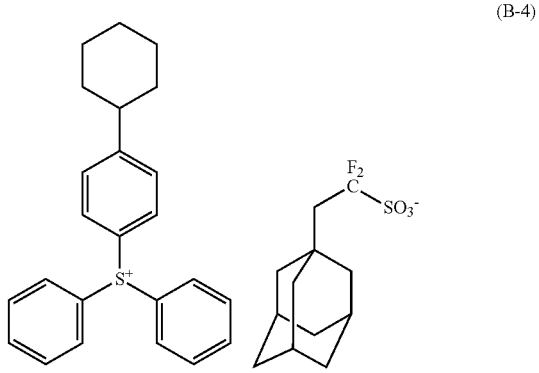

(B-4)

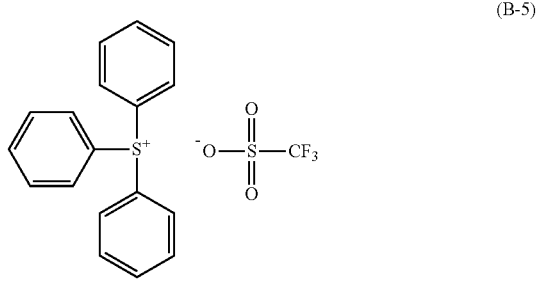

(B-5)

-continued

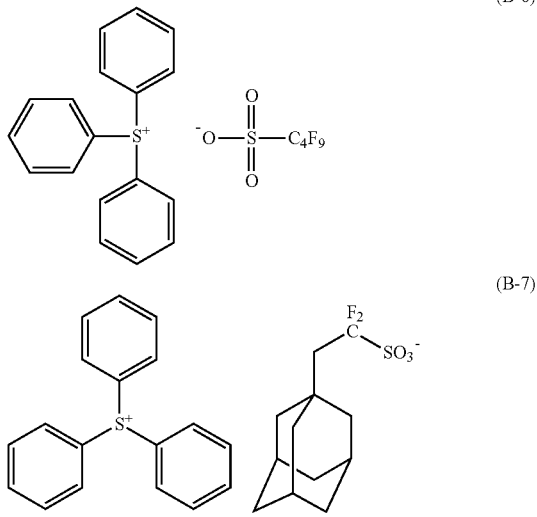

(B-6)

(B-7)

<Solvent>

The following compounds were used as a solvent (non-halogen-based solvent).
Propylene glycol monomethyl ether acetate (PGMEA)
Propylene glycol monoethyl ether (PGEE)
<Halogen-Based Solvent>
Methylene chloride was used as a halogen-based solvent.
<Preparation of Composition for Forming Underlayer Film>

Each of the above-described components was mixed to prepare a mixed solution having the formulation shown in the table shown in the latter part. A mixing ratio of each component in the mixed solution was adjusted so as to obtain each composition for forming an underlayer film, having the formulation shown in the table shown in the latter part.

A composition for forming an underlayer film was obtained by circulating 3500 g of the above-described mixed solution with a circulation filtering device having the configuration shown below, under normal pressure and a flow rate of 450 g/min, until the number of circulations reached 20 times.

The concentration of solid contents in each composition for forming an underlayer film was set in a range of 5.5% to 8.0% by mass.

Circulation filtering device: circulation filtering device including a solution tank, a filter A, a filter B, a diaphragm pump, and a Teflon (registered trademark) tube (inner diameter: 4 mm, length: 200 mm)

As the filter A, a polyamide-based synthetic fiber film ("Filter Capsule PhotoKleen DDF Ultipleat P-Nylon" manufactured by Nihon Pall Corporation; pore diameter: 20 nm, filter cloth area: 0.53 m$^2$) was used, and as the filter B, a polyethylene film ("Filter Capsule PhotoKleen DDFPE-Clean" manufactured by Nihon Pall Corporation; pore diameter: 10 nm, filter cloth area: 0.51 m$^2$) was used. In this case, the filter A was on an upstream side and the filter B was on a downstream side, and the two filters were connected by a Teflon (registered trademark) tube (inner diameter: 4 mm, length: 100 mm).

[Test]
<Solvent resistance>

The composition for forming an underlayer film of each Example or Comparative Example was applied in-line to a surface of a 12-inch silicon wafer using a spin coater ("ACT12" manufactured by Tokyo Electron Limited.), and baking was performed at 215° C. for 60 seconds to obtain a substrate with an underlayer film, which had an underlayer film having an average thickness of 33 nm.

The obtained substrate with the underlayer film was immersed in cyclohexanone at 25° C. for 5 minutes, and changes in average film thickness of the underlayer film before and after the immersion were compared.

In a case where an average film thickness before the immersion was defined as X0 and an average film thickness after the immersion was defined as X, the absolute value of the numerical value obtained by $(X-X0)\times100/X0$ was calculated, and the absolute value was regarded as a rate (%) of change in film thickness.

Solvent resistance was evaluated as "A" (good) in a case where the rate of change in film thickness was less than 1%, "B" (slightly good) in a case of being 1% or more and less than 5%, and "C" (poor) in a case of being 5% or more.
<Surface Flatness>

The composition for forming an underlayer film of each Example or Comparative Example was applied to a 12-inch diameter SiO$_2$ stepped substrate in which a trench (aspect ratio: 4.3) having a width of 42 nm, a pitch of 84 nm, and a depth of 180 nm and a trench (aspect ratio: 1.8) having a width of 100 nm, a pitch of 150 nm, and a depth of 180 nm were present.

Thereafter, the substrate was heated at 250° C. for 60 seconds under an air atmosphere to form an underlayer film having a film thickness of 200 nm. The film thickness of the underlayer film herein is intended to be an average distance, using a height of a recess portion of the stepped substrate (bottom of the trench) as a reference height, from the reference height to a surface of the underlayer film.

The shape of the underlayer film was observed with a scanning electron microscope ("S-4800" of Hitachi High-Technologies Corporation), and a difference (ΔFT) between the maximum value and the minimum value of the film thickness of the underlayer film was measured. Surface flatness was evaluated as "A" (very good) in a case where the ΔFT was less than 10 nm, "B" (good) in a case of being 10 nm or more and less than 30 nm, and "C" (poor) in a case of being 30 nm or more.

[Result]

The table below shows formulations and test results of the composition for forming an underlayer film of each Example or Comparative Example.

In the table, the column of "Formula" in the column of "Acid generator" indicates whether or not the acid generator used corresponds to the acid generator represented by General Formulae (1) to (3). A case of satisfying this requirement was evaluated as A, and a case of satisfying no requirement was evaluated as B.

The column of "Amount (Si 100 parts by mass ratio)" in the column of "Acid generator" indicates the content (parts by mass) of the acid generator in the composition for forming an underlayer film with respect to 100 parts by mass of the polysiloxane.

The column of "Solvent (mass ratio)" indicates the mass ratio of the content of each solvent (non-halogen-based solvent) in the composition for forming an underlayer film.

The column of "Amount (overall ratio)" described in the upper part of the column of "Halogen-based solvent" indicates the content (ppm by mass or ppb by mass) of the halogen-based solvent with respect to the total mass of the composition for forming an underlayer film. The column of "Amount (Si ratio)" described in the lower part of the column of "Halogen-based solvent" indicates the content (ppm by mass or ppb by mass) of the halogen-based solvent in the composition for forming an underlayer film with respect to the polysiloxane.

TABLE 1

| | Solid content | | | | Non-solid consent | | Evaluation result | |
|---|---|---|---|---|---|---|---|---|
| | Polysiloxane Amount | Acid generator Type | Formula | Amount (Si 100 parts by mass ratio) | Solvent (mass ratio) | Halogen-based solvent Amount (overall ratio Amount (Si ratio) | Surface flatness | Solvent Resistance |
| Example 1 | 100 | B-1 | A | 2.5 | PGMEA/PGEE = 7/3 | 1.1 ppb by mass 16 ppb by mass | B | B |
| Example 2 | 100 | B-3 | A | 2.5 | PGMEA/PGEE = 7/3 | 1.1 ppb by mass 21 ppb by mass | B | A |
| Example 3 | 100 | B-1 | A | 1.0 | PGMEA/PGEE = 8/2 | 3.0 ppb by mass 43 ppb by mass | B | A |
| Example 4 | 100 | B-2 | B | 2.5 | PGMEA/PGEE = 9/1 | 5.0 ppb by mass 73 ppb by mass | B | A |
| Example 5 | 100 | B-1 | B | 2.5 | PGMEA/PGME = 9/1 | 7.0 ppb by mass 103 ppb by mass | B | A |
| Example 6 | 100 | B-3/B-2 | A/B | 2.5/1.5 | PGMEA/PGEE = 7/3 | 8.0 ppb by mass 119 ppb by mass | B | A |
| Example 7 | 100 | B-3 | B | 1.0 | PGMEA/PGEE = 8/2 | 15.0 ppb by mass 216 ppb by mass | B | A |
| Example 8 | 100 | B-7 | A | 3.0 | PGMEA/PGEE = 9/1 | 3.0 ppm by mass 44 ppm by mass | A | A |
| Example 9 | 100 | B-5 | A | 3.0 | PGMEA/PGEE = 7/3 | 6.0 ppm by mass 77 ppm by mass | A | A |
| Example 10 | 100 | B-4 | A | 1.0 | PGMEA/PGEE = 9/1 | 25.0 ppm by mass 361 ppm by mass | A | B |
| Example 11 | 100 | B-7 | A | 2.5 | PGMEA/PGEE = 6/4 | 30.0 ppm by mass 439 ppm by mass | A | B |
| Example 12 | 100 | B-4 | A | 5.0 | PGMEA/PGEE = 6/4 | 50.0 ppm by mass 750 ppm by mass | A | B |
| Example 13 | 100 | B-3 | A | 2.0 | PGMEA/PGEE = 7/3 | 50.0 ppm by mass 729 ppm by mass | A | B |
| Example 14 | 100 | B-4 | A | 2.0 | PGMEA/PGEE = 7/3 | 50.0 ppm by mass 850 ppm by mass | B | B |
| Comparative Example 1 | 100 | B-5 | A | 2.5 | PGMEA/PGEE = 7/3 | 0.5 ppb by mass 7 ppb by mass | C | A |
| Comparative Example 2 | 100 | B-2 | B | 2.5 | PGMEA/PGEE = 8/2 | 80.0 ppm by mass 1171 ppm by mass | A | C |

From the results shown in the table, it was confirmed that the composition for forming an underlayer film according to the embodiment of the present invention can be used to form an underlayer film having excellent surface flatness and solvent resistance.

In a case where the content of the halogen-based solvent was 1.0 to 10.0 ppm by mass with respect to the total mass of the composition for forming an underlayer film, it was confirmed that the effects of the present were more excellent (referring to the results of Examples 8 and 9, and other Examples).

In a case where the content of the halogen-based solvent was 20 ppb by mass to 750 ppm by mass with respect to the total mass of the silicon atom-containing compound, it was confirmed that the effects of the present were still more excellent (referring to the results of Examples 1 and 14, and other Examples).

In a case where the content of the halogen-based solvent was 500 ppb by mass to 100 ppm by mass with respect to the total mass of the silicon atom-containing compound, it was confirmed that the effects of the present were still more excellent (referring to the results of Examples 8 and 9, and other Examples).

What is claimed is:

1. A A composition for forming an underlayer film, the composition comprising:
   a silicon atom-containing compound; and
   a halogen-based solvent,
   a non-halogen-based solvent,
   wherein a content of the halogen-based solvent is 1.0 ppb by mass to 50.0 ppm by mass with respect to a total mass of the composition for forming an underlayer film, and
   a concentration of solid contents in the composition for forming an underlayer film is 0.1% to 20% by mass.

2. The composition for forming an underlayer film according to claim 1,
   wherein the content of the halogen-based solvent is 1.0 ppm by mass to 10.0 ppm by mass with respect to the total mass of the composition for forming an underlayer film.

3. The composition for forming an underlayer film according to claim 1,
   wherein the content of the halogen-based solvent is 20 ppb by mass to 750 ppm by mass with respect to a total mass of the silicon atom-containing compound.

4. The composition for forming an underlayer film according to claim 1,
   wherein the content of the halogen-based solvent is 500 ppb by mass to 100 ppm by mass with respect to a total mass of the silicon atom-containing compound.

5. The composition for forming an underlayer film according to claim 1,
   wherein the silicon atom-containing compound is a siloxane compound.

6. The composition for forming an underlayer film according to claim 1,
wherein the silicon atom-containing compound is a hydrolysis condensate of one or more compounds selected from the group consisting of tetramethoxysilane, tetraethoxysilane, tetra-n-propoxysilane, tetra-iso-propoxysilane, tetraphenoxysilane, and a compound represented by General Formula (A), $$R^1{}_n Si(OR^2)_{4-n} \tag{A}$$

in General Formula (A), $R^1$ and $R^2$ each independently represent a monovalent organic group, and n represents an integer of 1 to 3.

7. The composition for forming an underlayer film according to claim 1, further comprising:
one or more compounds selected from the group consisting of an acid generator, a basic compound, and an acidic compound.

8. The composition for forming an underlayer film according to claim 7,
wherein the composition for forming an underlayer film includes the acid generator.

9. The composition for forming an underlayer film according to claim 7,
wherein the acid generator is a compound represented by any one of General Formula (1), (2), or (3),

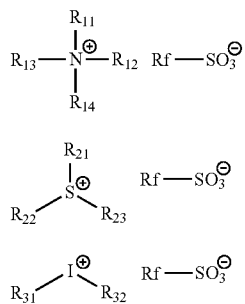

in General Formulae (1) to (3), $R_{11}$ to $R_{14}$, $R_{21}$ to $R_{23}$, $R_{31}$, and $R_{32}$ each independently represent an alkyl group or an aryl group, and Rf represents an organic group having one or more fluorine atoms;
in General Formula (2), two of $R_{21}$ to $R_{23}$ may be bonded to each other to form a ring.

10. The composition for forming an underlayer film according to claim 1,
wherein the halogen-based solvent includes one or more kinds selected from the group consisting of methylene chloride and chloroform.

11. A resist pattern forming method comprising:
forming an underlayer film on a substrate by using the composition for forming an underlayer film according to claim 1;
forming a resist film on the underlayer film by using a resist composition;
exposing the resist film; and
developing the exposed resist film with a developer to form a resist pattern.

12. A resist pattern forming method comprising:
forming a second underlayer film on a substrate by using a composition for forming a second underlayer film, which includes an aromatic ring-containing compound;
forming an underlayer film on the second underlayer film by using the composition for forming an underlayer film according to claim 1;
forming a resist film on the underlayer film by using a resist composition;
exposing the resist film; and
developing the exposed resist film with a developer to form a resist pattern.

13. The resist pattern forming method according to claim 11,
wherein the exposure is a liquid immersion exposure.

14. The resist pattern forming method according to claim 11,
wherein the developer is a developer including an organic solvent.

15. The resist pattern forming method according to claim 11,
wherein the developer is an alkali developer.

* * * * *